United States Patent
Hanson et al.

(10) Patent No.: US 10,795,425 B2
(45) Date of Patent: Oct. 6, 2020

(54) VERY LOW POWER MICROCONTROLLER SYSTEM

(71) Applicant: Ambiq Micro, Inc., Austin, TX (US)

(72) Inventors: Scott McLean Hanson, Austin, TX (US); Daniel Martin Cermak, Austin, TX (US); Eric Jonathan Deal, Austin, TX (US); Stephen James Sheafor, Boulder, CO (US); Donovan Scott Popps, Austin, TX (US); Mark A Baur, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 155 days.

(21) Appl. No.: 16/005,315

(22) Filed: Jun. 11, 2018

(65) Prior Publication Data

US 2019/0079574 A1    Mar. 14, 2019

Related U.S. Application Data

(63) Continuation of application No. 15/933,153, filed on Mar. 22, 2018.
(Continued)

(51) Int. Cl.
| | |
|---|---|
| *G06F 1/32* | (2019.01) |
| *G06F 1/26* | (2006.01) |
| *G06F 1/3234* | (2019.01) |
| *G06F 1/3287* | (2019.01) |
| *G06F 1/3203* | (2019.01) |
| *G06F 1/3237* | (2019.01) |

(Continued)

(52) U.S. Cl.
CPC .............. *G06F 1/3243* (2013.01); *G06F 1/26* (2013.01); *G06F 1/3203* (2013.01); *G06F 1/3237* (2013.01); *G06F 1/3275* (2013.01); *G06F 1/3287* (2013.01); *G06F 1/3296* (2013.01); *G11C 5/147* (2013.01); *G11C 5/148* (2013.01)

(58) Field of Classification Search
CPC .... G06F 1/3203; G06F 1/3243; G06F 1/3275; G06F 1/3287; G06F 1/26
See application file for complete search history.

(56) References Cited

U.S. PATENT DOCUMENTS

| | | | |
|---|---|---|---|
| 5,668,815 A | 9/1997 | Gittinger et al. | |
| 8,020,018 B2 * | 9/2011 | Hober | G06F 1/3203 713/300 |

(Continued)

OTHER PUBLICATIONS

Kwong et al. "A 65 NM SUB-VT Microcontroller With Integrated SRAM and Switched Capacitor DC-DC Coverter".

*Primary Examiner* — Stefan Stoynov
(74) *Attorney, Agent, or Firm* — David R. Stevens; Stevens Law Group

(57) ABSTRACT

A microcontroller system includes a processing unit supporting at least one near or sub Vt circuit and a plurality of memory blocks, each memory block connected to a DMA controller and independently power controlled. A power control system uses power gates to power control at least the memory blocks. In some embodiments, a wake-up interrupt controller is connected to the power control system and a voltage regulator system is used to supply voltage to separate power domains, with the voltage regulator systems controlled at least in part by power gates operated by the power control system. A plurality of clocks can be connected to define clock domains associated with separate power domains.

22 Claims, 26 Drawing Sheets

Related U.S. Application Data

(60) Provisional application No. 62/557,534, filed on Sep. 12, 2017.

(51) Int. Cl.
    *G11C 5/14*     (2006.01)
    *G06F 1/3296*     (2019.01)

(56) References Cited

U.S. PATENT DOCUMENTS

| | | | |
|---|---|---|---|
| 9,348,402 B2 * | 5/2016 | Zanotelli | G06F 1/3243 |
| 2003/0093702 A1 | 5/2003 | Luo et al. | |
| 2008/0293449 A1 * | 11/2008 | Barlow | G06F 1/3203 455/556.1 |
| 2009/0295467 A1 | 12/2009 | Berzins et al. | |
| 2012/0131309 A1 | 5/2012 | Johnson et al. | |
| 2015/0346001 A1 | 12/2015 | Tripathi et al. | |
| 2017/0060151 A1 | 3/2017 | Vaisband et al. | |

* cited by examiner

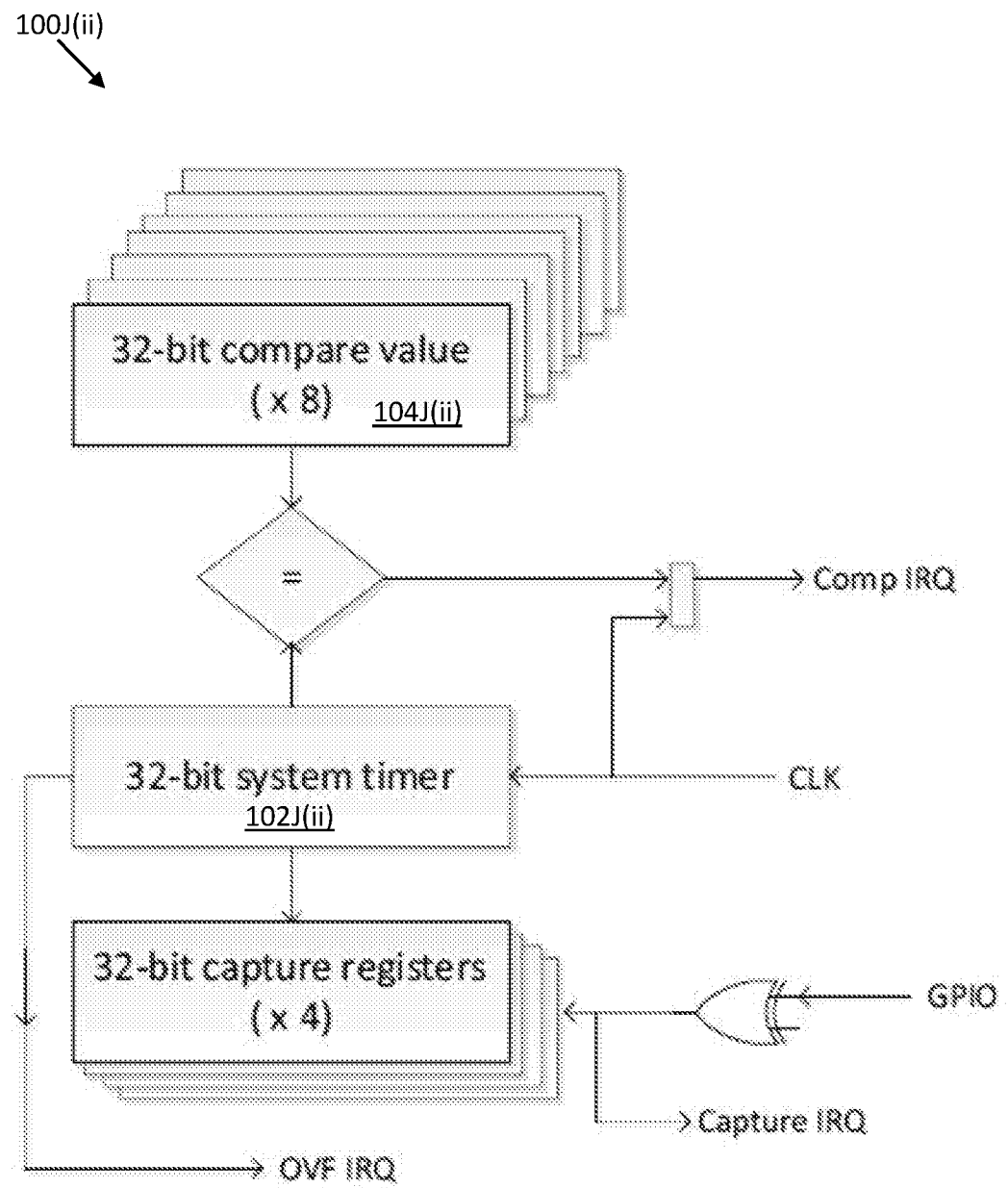
Fig. 1J(ii)

ADC State Diagram

920

930

VERY LOW POWER MICROCONTROLLER SYSTEM

RELATED APPLICATION

This application is a continuation of U.S. application Ser. No. 15/933,153, filed Mar. 22, 2018, and entitled Very Low Power Microcontroller System, which claims the benefit of U.S. Application Ser. No. 62/557,534, filed Sep. 12, 2017, and entitled Very Low Power Microcontroller System. The applications are hereby incorporated herein by references in their entirety for all purposes.

FIELD OF THE INVENTION

A very low power microcontroller system is described. Components, circuits, and methods for reducing power requirements by using improved power gating and clock circuits are described. Near or sub-$V_t$ circuits can be used in some embodiments.

BACKGROUND AND SUMMARY

In recent years, due to the growth of portable electronics, there has been a push to decrease the power used by microcontrollers (or "MCU"), microprocessors, application processors and other circuits used in portable electronic appliances. With lower power requirements, effective electronics operation time can be extended, or alternatively, smaller batteries can be used. Commonly, the power consumption of a microcontroller and associated circuits may be reduced by using a lower supply voltage, or by reducing the amount of internal capacitance being charged and discharged during the operation of the circuit.

One method for reducing microcontroller power relies on hardware or software-based power mode switching. Power modes can be selected for microcontroller components or resources based on operating state, operating conditions, and/or sleep cycle characteristics and other factors to configure low power modes for selected microcontroller components at the time the processor enters a low power or sleep state. In some systems, a set of predefined low power configurations can be used, while more sophisticated systems can dynamically select low power configurations to maximize power savings while still meeting system latency requirements.

However, even with available low power modes, microcontroller power usage can be adversely affected by interactions with connected sensors, memory systems, or other peripherals. Frequent interrupts or requests for service from such peripherals can greatly limit the time a microcontroller can remain in a low power mode. Systems that provide a reliable overall power management protocol and components for very low power operation are still needed.

To reduce or mitigate the foregoing described problems, in one embodiment, a low power microcontroller system is provided that can include a processing unit supporting at least one near or sub-Vt circuit and a plurality of memory blocks, each memory block connected to a DMA controller and independently power controlled. The processing unit can include a plurality of cores in some embodiments, with the memory blocks (e.g. an SRAM instance) interconnected to a least one core.

A power control system that includes power gates to power control at least the memory blocks can be connected, as well as a wake-up interrupt controller connected to the power control system. A voltage regulator system including at least one of a buck converter and a LDO can supply voltage to separate power domains, with the voltage regulator systems controlled at least in part by power gates operated by the power control system. The system also includes a plurality of clocks connected to define clock domains associated with separate power domains. The clocks can be gated by a DMA controller, with clock gate circuits optionally including a latch. In some embodiments, clocks can be used without synchronization (e.g. SRAM clocks)

In such a described system, a first and second transistors respectively having differing Vt can be supported. Stacked transistors can also be used. In other embodiments, the microcontroller system can include always-on circuits (e.g. for a wake-up controller) and the memory blocks can be each connected to at least one voltage regulator. Power savings can be realized by supporting power control system that can sequence power distribution to separate power domains.

In another embodiment, a microcontroller system includes a processing core and a plurality of memory blocks. Always-on circuitry having at least some transistors operating in near-Vt mode for low power operation can be connected to the processing core, and a power control system able to inactivate at least some of the plurality of memory blocks by power gating is provided. Each memory block can be connected to a DMA controller and independently power controlled.

In some embodiments, the always-on circuitry can be connected to timing, voltage, and I/O peripherals, and responds to on-chip interrupts, off-chip requests, or reset circuitry. Alternatively, the always-on circuitry can be activated in response to a counter or timer state. To improve power savings, the always-on circuitry can be in a separate power domain from the core.

In another embodiment, a microcontroller system includes a processing core and a plurality of memory blocks. A DMA system can be connected to the plurality of memory blocks, with the DMA system including a DMA controller. At least two peripherals, with each peripheral having associated logic circuitry can also be connected to the DMA system, with each peripheral and its associated logic circuitry being supported in a distinct power domain.

To improve power performance, in some embodiments, the DMA system can be power gated. The DMA system can also include an arbiter to determine which of the plurality of memory blocks is accessible and use a crossbar to enable communication between the plurality of memory blocks. In some embodiments, peripherals are allowed to access memory independently of the processing unit.

Other power saving features of the microcontroller system are provided by a power control system that includes power gates to power control the plurality of memory blocks. The microcontroller system can include voltage regulator systems for supplying voltage to separate power domains of the at least two power gated peripherals and power gates to power control at least some of the memory blocks. A plurality of clocks can be connected to define clock domains associated with separate power domains of the peripherals.

In another embodiment, a microcontroller system includes at least two processing units operating at respective first or second clock frequencies and each able to make requests for memory access. At least one memory block is connectable to the processing units, and an arbitration circuit can be used to manage memory access requests from the processing units. A clock muxing circuit can apply, in response to arbitration circuit request, the respective first or second clock frequency of the respective processing units to the connected at least one memory block.

In some embodiments, the at least two processing units can operate at respective first or second clock frequencies in distinct power domains. Voltage regulator systems can supply voltage to distinct power domains, and power gating circuitry, including power gating of memory blocks, can also be supported. In some embodiments, the respective first or second clock frequencies are different, while in others the respective first or second clock frequencies are identical and clock phase is different. Commonly, the respective first or second clock frequencies have a small integer ratio relationship.

In another embodiment of a microcontroller system, a processing unit and a plurality of memory blocks are connected to a power gate capable DMA system with the DMA system including a DMA controller. At least two peripherals, with each peripheral having associated logic circuitry connected to the DMA system, are supported in a distinct power domain. Advantageously, transfer information can be accumulated into the peripherals while the DMA system is power gated. This allows support of a deep-sleep mode wherein the DMA system is power gated while the microcontroller is in deep-sleep mode.

In another embodiment, a microcontroller system includes a processing unit in at least one power domain, with the processing unit having a plurality of transistors with differing Vt to permit various power operational modes. A plurality of memory blocks in at least one power domain is also provided, with each memory block connected to a DMA controller and independently power controlled. A power control system, including power gates, can be used to power control at least the memory blocks. Voltage regulator systems can also be connected to supply voltage to separate power domains, with the voltage regulator systems controlled at least in part by power gates operated by the power control system.

DETAILED DESCRIPTION

Figure 1A:
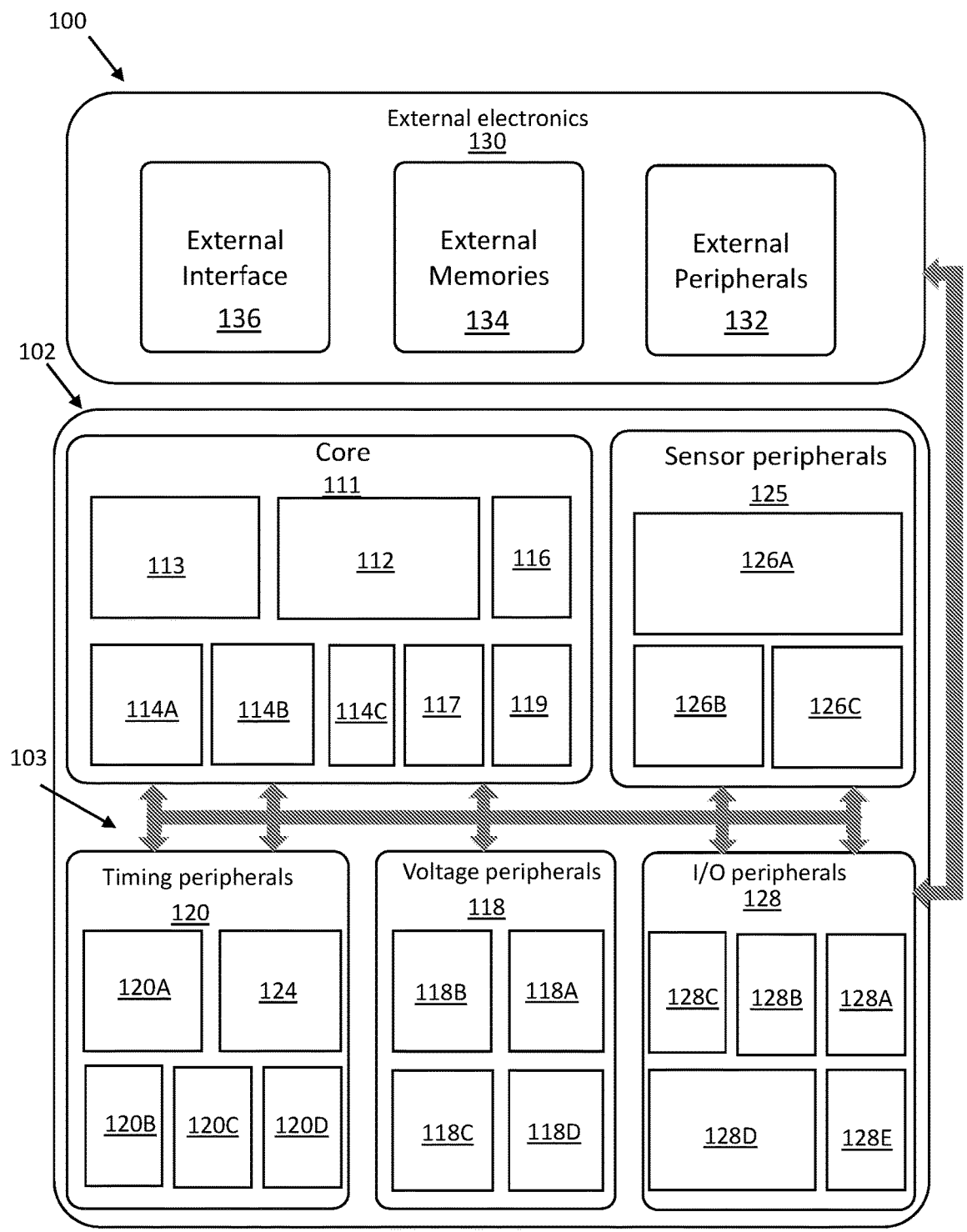
FIG. 1A schematically illustrates a low power microcontroller system.

FIG. 1 schematically illustrates a microcontroller system 100 having microcontroller 102 with various peripherals including timing peripherals 120, voltage peripherals 118, and serial communication peripherals 128. Some or all of the peripherals can include always-on circuits 103 that allow at least a part of the peripheral circuitry to be operational in low power modes. As will be understood, the microcontroller 102 can be a general processor, application specific processor, microprocessor, logic circuits, or any other form of computing element able to benefit from the techniques described herein.

A core 111 includes a CPU 112 with debug port 113 (e.g. digital core), internal memory including first memory 114A, second memory 114B, cache 114C, a power management unit 116, wakeup interrupt controller 117 and reset controller 119.

The voltage peripherals 118 can include various voltage regulation systems, including a buck converter 118A, power on reset 118B, brownout detector 118C, and supply voltage monitor 118D.

Timing peripherals 120 can include real-time clock (RTC) 120A, high frequency RC clock (HFRC) 120B, low frequency RC clock (LFRC) 120C, external clock (XTAL) 120 D, and counter/timers 124.

Input/output (I/O) peripherals 128 can include a pulse code modulation (PCM) master 128A (which provides pulse density modulation to PCM conversion), a universal asynchronous receiver-transmitter (UART) 128B, a 50-channel general-purpose input/output (GPIO) 128C, an inter-integrated circuit/serial peripheral interface (I2C/SPI) Master/Slave 128D, and an inter-IC sound (I2S) 128E.

Sensor peripherals 125 can include an analog to digital converter (ADC) 126A, temperature sensor 126B, and voltage comparator 126C.

Other peripheral components such as wireless blocks, Bluetooth radio, or on-die sensors can be connected via one or more internal buses or control/data transfer systems. The microcontroller 102 can be further connected via the I/O 128 to external electronics 130 such as external peripherals 132 (including sensors), external memory 134, and external interface systems 136.

The microcontroller system 100 can include a wide range of transistor or circuit types able to produce substantial power savings. For example, in one embodiment, CPU circuits can be configured to operate in a mode often referred to as "sub-Vt" or "near-Vt", with Vt being the threshold voltage at which a transistor switches between an open and closed gate-controlled channel Near-Vt is contrasted with "super-Vt" design technique, a conventional approach where transistors are biased well above (typically a few 100 mV or a few V) over their threshold voltage ("Vt"). Sub-Vt circuits are operated at a bias level below the conventional Vt level, and may require special circuit layouts for reliable operation. Advantageously, under many conditions, near and sub-Vt circuits can conduct digital processing at power levels significantly less than that required by super-Vt circuits, although processing speed can be decreased by one or more orders of magnitude. In other embodiments, a mixture of sub or near threshold circuits can be used in conjunction with conventional super-Vt circuits. Advantageously, such near and sub-Vt circuits can be located in distinct power domains and can act as low power "always-on" or wakeup circuits. In other embodiments, near and sub-Vt circuits can be used for applications requiring only low processing rates, including power calibration, sensor support, or timers. In one embodiment, "sub-Vt" can be defined as operating a transistor below this transistor Vt, "near-Vt" can be defined as operating on a transistor with a voltage between 1 and 2 Vt, and "super-Vt" as operating the transistor above 2 Vt.

For advanced technologies, where the threshold voltage characteristics varies with bias, we could use the saturated threshold voltage definition, where the threshold voltage "Vt" is defined as the intersect of the voltage axis in the Ids vs. Vgs curve, with the Vds of the transistor being at supply voltage level. In another embodiment, "near-Vt" can be defined as operating a transistor with voltages 200 mV to 300 mV below nominal supply level, the nominal supply level being set as industry standard by the semiconductor manufacturer.

The microcontroller system 100 can be used in a wide range of applications but is particularly suited for low power, battery-powered applications requiring sensor measurement and data analysis. In a typical system, the microcontroller system serves as an applications processor for one or more sensors and/or radios. The microcontroller system can measure analog sensor outputs using the integrated ADC, and digital sensor outputs using the integrated serial master ports. The processing unit or units integrated in this microcontroller system are capable of running complex data analysis and sensor fusion algorithms to process the sensor data.

With improved energy efficiency for sensor conversion and data analysis, the microcontroller system 100 enables extended battery life for a variety of products, including smart watches, fitness trackers, location trackers and industrial applications. For example, a fitness monitoring device normally having weeks of life on a rechargeable battery could be redesigned to achieve a year or more of life using the described microcontroller system 100 and a non-rechargeable battery. Similarly, the microcontroller system 100 enables the use of more complex sensor processing algorithms due to its very low active mode power. By using the microcontroller system, a fitness monitoring device could achieve the current multi-day or multi-week battery life while adding new computation-intensive functions like context detection and gesture recognition.

As an example, the system 100 can be used in a heart rate fitness tracker. In addition to heart rate monitoring, multiple functions such as step count, heart rate monitoring and sleep monitoring can also be performed. In a smart watch, in addition to heart rate tracking, time display, information display relayed from a smartphone, audio command entries and many other functions can be integrated. Asset tracking will typically integrate in a system a GPS for position knowledge with other sensors to store a variety of parameters such as temperature, position, orientation; an asset tracking tag can be affixed to a piece of luggage, or to a crate being shipped, and track its location, whether it is submitted to high temperature or being dropped or hit.

The described microcontroller system can be used in a system relying on audio interfaces, where the system is capable of detecting voice, recognizing keywords, streaming music files, isolating from background noise and amplifying a speaker's voice, and providing active noise reduction or echo cancellation. Alternatively, the microcontroller system can be used in a system to recognize a face, detect motion and determine a person's or object's context.

For those embodiments including heart rate monitoring on someone wearing a fitness tracker, the microcontroller system can, at periodic intervals, trigger a light that will shine on the wearer skin, retrieve reflected light through a light capturing sensor, digitize the resulting analog signal, store the digitized signal in memory, process the digitized signal inside a processing unit, through that process extract the heart rate value, and store the resulting value in memory. While these steps are happening, the user can also access the value on a display, or through radio communication to a smartphone.

To minimize power during operation, unused blocks, such as the IOs receiving motion sensor inputs, can be power-gated. To keep track of the wearer heart rate, the heart rate may be measured every minute, following the sequence described above. In-between measurements, memory blocks, such as SRAM and Flash, ADC, and processing unit(s) can be power-gated. To minimize power in-between measurements, time keeping and measurement trigger circuitry can be built with high Vth transistors and operated at low voltages. In some embodiments, registers and gates in this circuitry are built with non-minimum gate length, and can include stacking devices. For embodiments with SRAM memory blocks, SRAM not being used in-between measurement can be power-gated. The code to execute the measurement can be either downloaded from non-volatile Flash for each measurement, or stored in SRAM, which allows SRAM to be put in deep-sleep in-between the measurements. The power control unit can manage setting the power mode of these blocks during the different phases of the heart rate monitoring.

Power usage can also be reduced by taking advantage of multiple clocks. Different blocks operating simultaneously, such as a processing unit and the ADC, can have different clocks. The ADC may operate at a first clock rate to ensure sufficient accuracy, and transfer data through DMA circuitry to the SRAM at that clock rate with the SRAM at a first supply voltage. The processing of the data stored in SRAM can be done at a second clock rate and a lower supply voltage in order to save power during processing. While the ADC is active, the processing unit may not be active.

These first and second clock rates and supplies can further be adjusted based on the semiconductor processing characteristics, as stored in a register, and by the temperature of the system, if the system includes a temperature sensor. The power control block can manage switching the supply control from a buck converter to power the ADC during measurement to an LDO regulator in-between measurements, or by setting the proper power mode for a given circuit.

In some embodiments, a processing unit may include a floating point unit. Advantageously, this allows use of application code that is normally executed in floating point form without the need to perform extensive fixed point optimizations.

In other configurations, a host processor can communicate with the microcontroller system over its serial slave port using standard industry Input/Output communication protocols such as I2C, SPI or I2S.

The CPU unit, or processing unit, can be a 32-bit core such as an ARM processor, including a floating point unit with several tightly coupled on-die peripherals. Code and data may be stored in an integrated non-volatile memory and/or in a low leakage RAM. The Wake-Up Interrupt Controller (WIC) coupled with the processing unit supports sophisticated and configurable sleep state transitions with a variety of interrupt sources.

On-die sensor peripherals enable the monitoring of several sensors. An integrated temperature sensor enables the measurement of ambient temperature. Other on-die peripherals such as the ADC could be a low power Successive Approximation Register (SAR) Analog-to-Digital Converter (ADC), able to monitor the temperature sensor, several internal voltages, and external sensor signals. The ADC can be uniquely tuned for minimum power with a configurable measurement mode that does not require microcontroller system intervention. In addition to integrated analog sensor peripherals, standard I2C/SPI/PDM master ports and/or UART ports enables the microcontroller system to communicate with external sensors and radios (e.g. an external Bluetooth transceivers) that have digital outputs.

The microcontroller system can also include a set of timing peripherals and an RTC (Real Time Clock). A general purpose Timer/Counter Module (CTIMER) can also be included, such as described in application U.S. patent application Ser. No. 15/674,242 filed Aug. 10, 2017, the disclosure of which is hereby incorporated by reference. as well as a 32-bit System Timer (STIMER). The RTC may be driven independently by one of three different clock sources: a low frequency RC oscillator, a high frequency RC oscillator, and a 32.768 kHz crystal (XTAL) oscillator. These clock sources may use techniques such as the ones described in application U.S. patent application Ser. No. 14/379,426 "Pulse Injection Crystal Oscillator", the disclosure of which is hereby incorporated by reference.

In some embodiments, the microcontroller system can include clock reliability functions, by which, for example, the RTC can automatically switch from an XTAL source to an RC source in the event of an XTAL failure. In another embodiment, the microcontroller system can synchronize the RC oscillator to the XTAL and turn off the XTAL clock to save power, as has been described in U.S. Pat. No. 8,924,765 filed Feb. 21, 2012. Further calibration is possible for the high frequency RC oscillator, as described in U.S. patent application Ser. No. 14/879,863 filed on Oct. 9, 2015, the disclosure of which is hereby incorporated by reference.

The following sections provide examples of behavior, function, and connectivity related to both on-die and external peripherals controlled by the microcontroller system processor core. Multiple instances of a peripheral can exist in the microcontroller system, e.g., one embodiment has six I2C/SPI master modules. Within the microcontroller system, multiple peripherals can generate interrupts. In some cases, a single peripheral may be able to generate multiple different interrupts. Each interrupt signal generated by a peripheral is connected back to the processing unit in two places. First, the interrupts are connected to the Interrupt Controller inside the processing core. This connection provides the standard changes to program flow associated with interrupt processing. Additionally, they are connected to the WIC outside of the processing unit, allowing the interrupt sources to wake the processing unit when it is in a deep sleep mode.

The processing unit can utilize various instances of a system bus for communication with memory and peripherals. An ICode bus can be used for instruction fetches from the 'Code' memory space while a DCode bus is designed for data and debug accesses in that same region. In some embodiments, a System bus is used for fetches to the SRAM and other peripheral devices of the MCU.

The microcontroller system can map available SRAM memory onto an address space within the 'Code' memory space. This gives a user the opportunity to perform instruction and data fetches from the lower-power SRAM to effectively lower the power consumption of the microcontroller system.

Peripherals of the microcontroller system which are infrequently accessed can be located on a separate peripheral bus. A bridge exists which translates the accesses from a system bus to the peripheral bus. Accesses to these peripherals will inject wait-states as needed on a system bus during any access cycle.

The Power Management Unit (PMU 116) is a finite-state machine that controls the transitions of the microcontroller system between power modes. When moving from Active Mode to Deep Sleep Mode, the PMU manages the state-retention capability of the registers within the processing unit and also controls the shutdown of the voltage regulators of the microcontroller system. Once in the Deep Sleep Mode, the PMU, in conjunction with the Wake-Up Interrupt Controller, waits for a wakeup event. When the event is observed, the PMU 116 begins the power restoration process by re-enabling the on-chip voltage regulators and restoring the CPU register state. The processing unit is then returned to active mode once all states are ready.

Various examples of microcontroller system power modes are herein described, along with the operation of the PMU. The processing unit may include the following 4 power modes: Active, Sleep, Deep Sleep and Shutdown. In Shutdown the entire microcontroller system is powered down except for the logic required to support a Power-On Reset. In the Active Mode, the processing unit is powered up, clocks are active, and instructions are being executed. In this mode, the processing unit can interact with all enabled devices attached to the system bus and peripheral bus to be powered and clocked for normal access.

To transition from the Active Mode to any of the lower-power modes, a specific sequence of instructions is executed on the processing unit. First, specific bits in a System Control Register (SCR) must be set to determine the mode to enter. After the SCR is setup, code can enter the low-power states using one of the two following methods: 1) by executing a Wait-For-Interrupt (WFI) instruction, or 2) by setting a bit of the SCR such that the exit from an interrupt will automatically return to a sleep state. The processing unit will enter a low-power mode after one of these are performed (assuming all conditions are met) and remain there until some event causes the core to return to Active Mode. Possible reasons to return to Active Mode are: reset, an enabled Interrupt is received by the internal interrupt controller, a Debug Event.

In the Sleep Mode, the processing unit is powered up, but the clocks are not active. The power supply is still applied to the processing unit logic such that it can immediately become active on a wakeup event and begin executing instructions.

In the Deep Sleep Mode, the processing unit enters a mode where the main power is removed, but the flops retain their state. The clocks are not active, and the microcontroller clock sources can be deactivated. To facilitate the removal of the source supply and entry into this mode, the processing unit will handshake with the Wake-up Interrupt Controller and Power Management Unit and set up the possible wakeup conditions.

In addition to the processing unit power states, additional system power states can be defined as follows:

System active—the processing unit is in Active Mode and executing instructions. All peripheral devices are on and available.

System Sleep Mode 0—a low power state for the microcontroller. In this mode, all SRAM memory is retained, Flash memory is in standby, high frequency clock (HFRC) is on, main core clock domain is gated but peripheral clock domains can be on. Processing unit is in Sleep Mode. This state can be entered if a peripheral device (including, but not limited to those peripheral devices connected via SPI/UART/I2C) is actively transferring data and the time window is sufficient for the processing unit to enter Sleep Mode but is not long enough to go into a Deep Sleep Mode.

System Sleep Mode 1—a low power state for the microcontroller. In this mode, all SRAM memory is retained, Flash memory is in standby, HFRC is on, and all functional clocks are gated. Processing unit is in Sleep Mode. This state can be entered if a no peripheral device is actively transferring data, however, communication may occur within a short time window which will prevent the CPU from entering Deep Sleep Mode (and subsequently the system from entering a lower power state). This state is also referred to as "Active Idle". All power domains are powered on, but all clocks are gated. This state is a provides a good power baseline for the system since it represents the active mode DC power level. Typically the power in this state is dominated by leakage and always-on functional blocks.

System Deep Sleep Mode 0—a deep low power state for the microcontroller system. In this mode, SRAM is in retention (how much SRAM is in retention is controlled by software), cache memory is in retention, Flash memory is in power down, HFRC is on, and main core power domain is off but peripheral power domains can be on. Processing unit is in Deep Sleep and Core logic state is retained. This state can be entered if a peripheral device is actively or intermittently transferring data, but the window of acquisition is still long enough to allow the processing unit to go into a deeper low power state. For example, in a heart rate monitor, intervals between heartbeats are sufficiently long that the microcontroller system can enter System Deep Sleep Mode 0 in between heartbeats, only waking to higher power states several milliseconds before a potential heartbeat is expected.

System Deep Sleep Mode 1—a deep low power state for the microcontroller system. In this mode, SRAM is in retention (capacity controlled by software), cache memory is powered down, Flash memory is in power down, HFRC is on, main core power domain is off but peripheral power domains can be on. Processing unit is in Deep Sleep. Processing unit logic state is retained. This state can be entered if the latency needed to ready the cache can be tolerated. This could be an extended wait for peripheral communication event.

System Deep Sleep Mode 2—a minimum power state where the microcontroller system can resume normal operation afterwards. In this mode, only minimal SRAM memory is retained as needed for software execution to resume. Cache is powered off (no retention), Flash memory is in power down, HFRC is off, slow frequency clock XTAL is ON, all internal switched power domains are off/gated. Processing unit is in Deep Sleep. Core logic state is retained. This state can be entered when all activity has suspended for a duration of time sufficient to sustain the longer exit latencies to resume. This could be a state can be used, for example, when periodic data samples need to be taken and the data is locally processed, accumulated, or transferred after long time intervals. This state can only be entered if the peripheral devices are either not enabled/active or if the application can afford to save/restore the state of the controller(s) on entry/exit of this mode.

System Deep Sleep Mode 3—a deep sleep power state for the microcontroller. In this mode, no memory is in retention, all memory is powered down, low frequency clock LFRC is on (HFRC and XTAL are off), all internal switched power domains are off/gated. Processing unit is in Deep Sleep. Core logic state is retained. Single timer is running. This state can be entered on long inactivity periods. This mode can also be used for very low power ADC sampling without processing unit interaction.

System OFF Mode—the microcontroller is completely powered down with no power supplied. The processing unit is in shutdown mode with no state retention. Only Flash memory is retained. In one embodiment, this mode is externally controlled with respect to the microcontroller system by removing supplied power.

It is to be noted that the Power Management Unit communicates with each block in order to power-gate the blocks, in other words to shut down the power to the block entirely, or put the block in one of the modes described above. In order to keep the status of these blocks known, most blocks contain a few gates and registers that are considered "always-on circuitry". This circuitry is on a separate power supply than the rest of the block, so that when the block is power-gated, the information in the always-on circuitry related to this block is not lost. Collectively, "always-on circuitry" can refer to the registers and logic kept powered when blocks are powered down. Such circuitry is used to communicate with the Power Management Unit. It is also use to monitor for an external stimulus that would trigger an interrupt to wake-up the system, for example.

As will be appreciated, in one embodiment the microcontroller system can support a single processing unit, while in other embodiments the microcontroller can have multiple processing units, which may or may not be similar in construction. Each processing unit can have the power modes described above, and multiple processing units can support other modes that include combinations of the previously described modes. For example, a dual processor core system can support a combination mode in which one processor is active, while a second processor is in sleep mode.

Figure 1B:
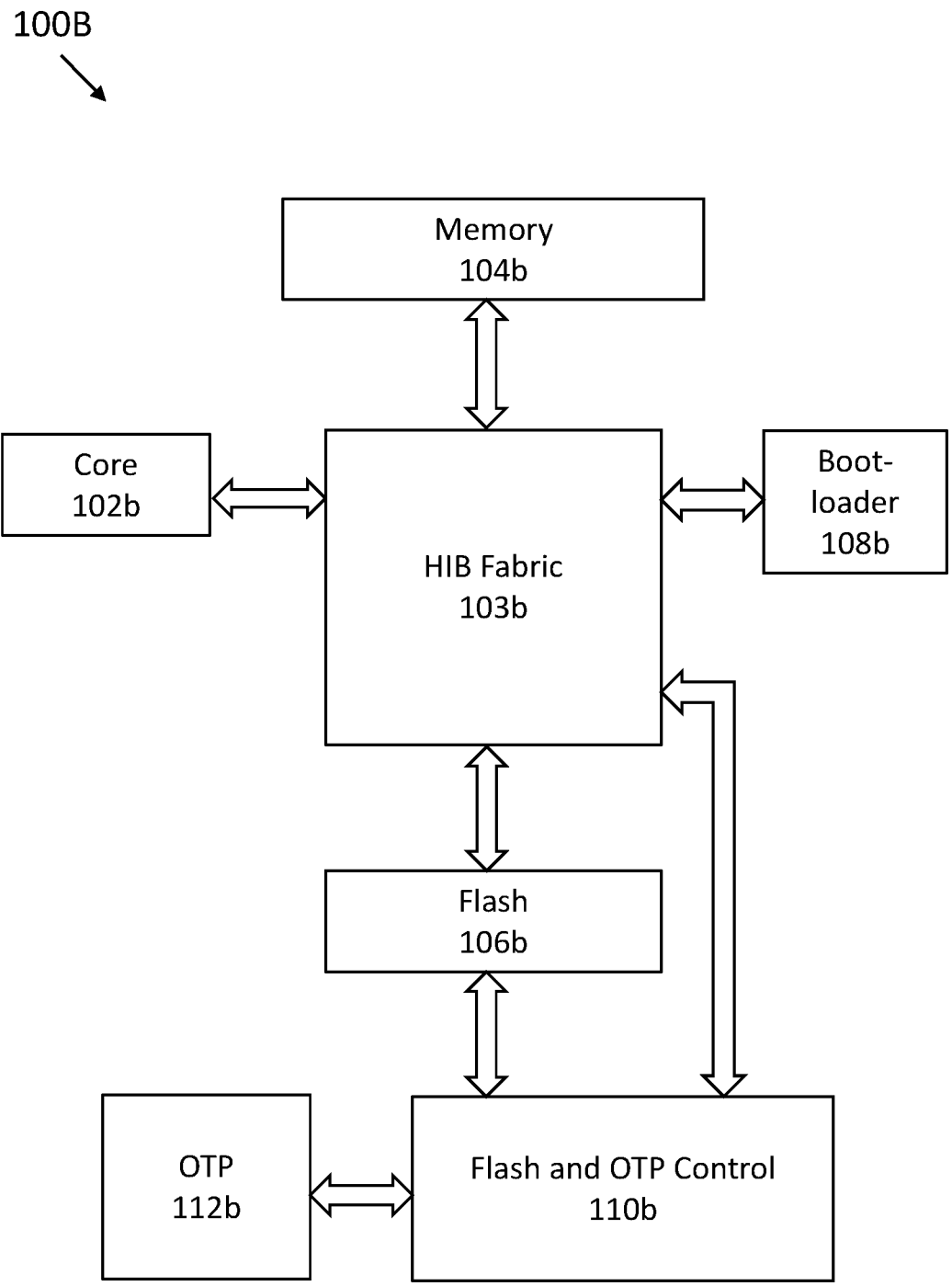
FIGS. 1B-1N schematically illustrate various embodiments of selected modules in the low power microcontroller system of FIG. 1A.

As shown in FIG. 1B, in one embodiment a memory system 100B for a microcontroller system can support at least four kinds of memory interconnected by a High-performance Interconnect Bus (HIB") Fabric 103B. Memory can include but is not limited to SRAM 104B, Flash 106B (with Flash cache), Boot Loader ROM 108B, and One Time Programmable (OTP) memory 110B. The OTP contains factory preset per chip trim values and another area 112B for the final user application, including Flash protection fields, to control read and write capabilities of Flash memory blocks 106B. A block can be protected for read and write and only available for execution. OTP bits can specify the Debugger Lock Out state. OTP bits can protect SRAM content from Debugger inspection.

The microcontroller system integrates on-board flash memory and one-time programmable memory. These two memories are managed by a flash memory controller 110B for write operations. A Flash Cache controller may also manage Flash access during read operations. During normal microcontroller code execution, the Flash Cache Controller translates requests from the processing unit to the Flash Memory instance for instruction and data fetches. The Flash Cache Controller is designed to return data in zero wait-states when accesses hit into the cache and can operate up to the maximum operating frequency of the processing unit. On cache misses, the controller issues miss requests to the Flash Cache controller.

The Flash Memory Controller 110B facilitates flash erase and programming operations. When erase or programming operations are active, instructions cannot be fetched for execution from the Flash memory, so the on-chip SRAM would have to be used for code execution. The Flash Cache controller ensures these operations are synchronized. To facilitate the management of flash updates and OTP programming, a number of flash helper functions are provided in the boot loader ROM 108B. The boot loader ROM 108B may contain instructions that are executed upon power up of the system. Once a valid reset vector is established at offset zero in the flash memory, the boot loader 108B transfers control to a user application by issuing a POR (Power On Reset) that causes the processing unit to enter the reset vector in flash. This process occupies less than 100 instructions in the boot loader. The remainder of the boot loader is occupied by a set of flash helper functions.

Figure 1C:
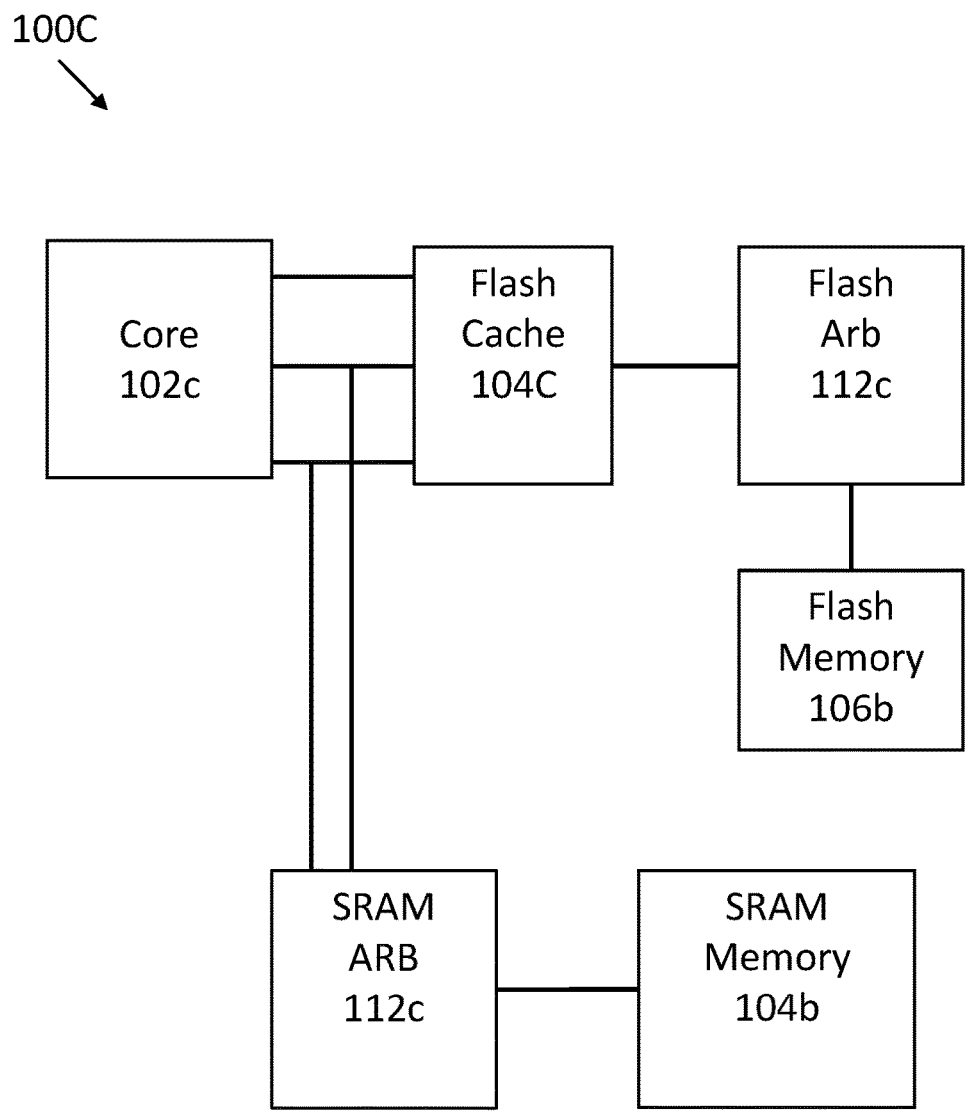

FIG. 1C illustrates one example of a Flash cache system 100C. The microcontroller system 102C incorporates a Flash cache connected to an ICode and DCode bus path from the processing unit. This controller is intended to provide single cycle read access to Flash 106C and reduce overall accesses to the Flash 106C to reduce power. The controller may be a unified ICode and DCode cache controller. The cache fill path is arbitrated (Flash Arb 108C) between cache misses as well as the other Flash read agents such as Info block, debug, self-test.

A number of registers are used to control and monitor the status of the memory blocks and the related caches. The cache can be enabled by software by loading a cache control register. This register will power up the cache SRAMs 110C and initiate the cache startup sequence which will flush the cache RAMs. Once the sequence is complete (indicated by a bit in the cache control register), the cache will automatically begin servicing instruction and/or data fetches from the cache depending on the state of the 2 registers controlling Icache and Dcache. Arbitration is provided by SRAM Arb 112C. Software can choose to enable/disable these independently and they can be dynamically changed during operation. Additionally, the non-cacheable region registers can be used to mark regions as non-cached, which supercedes the I/D enable bits and causes all fetches from within this range to be non-cached.

The cache will automatically flush data contents if flash is erased/programmed or if the primary cache enable bit is disabled. Additionally, software can invalidate the cache by writing a dedicated bit in the cache control register.

The cache may also include logic to monitor cache performance, which can be used in conjunction with the STIMER or CTIMER to determine elapsed time. The instruction and data buses have independent monitoring logic that keep counts of the total number of reads performed on the bus, of the number of tag lookups performed, of the number of tag lookups that result in a hit, of the number of reads that were serviced from the line buffers (on a miss or non-cached access) or directly from the RAM because they fell within the same line as the previous lookup.

Cache monitor counters can automatically freeze the counts when either of the access counters reaches a value of 0xFFFF0000 to prevent the counters from rolling over. The monitor counts can be reset at any time by writing to a reset bit in the cache control register. Further cache register bits can control the power mode of each individual cache SRAMs and Flash blocks, and clock gating of these blocks.

Figure 1D:
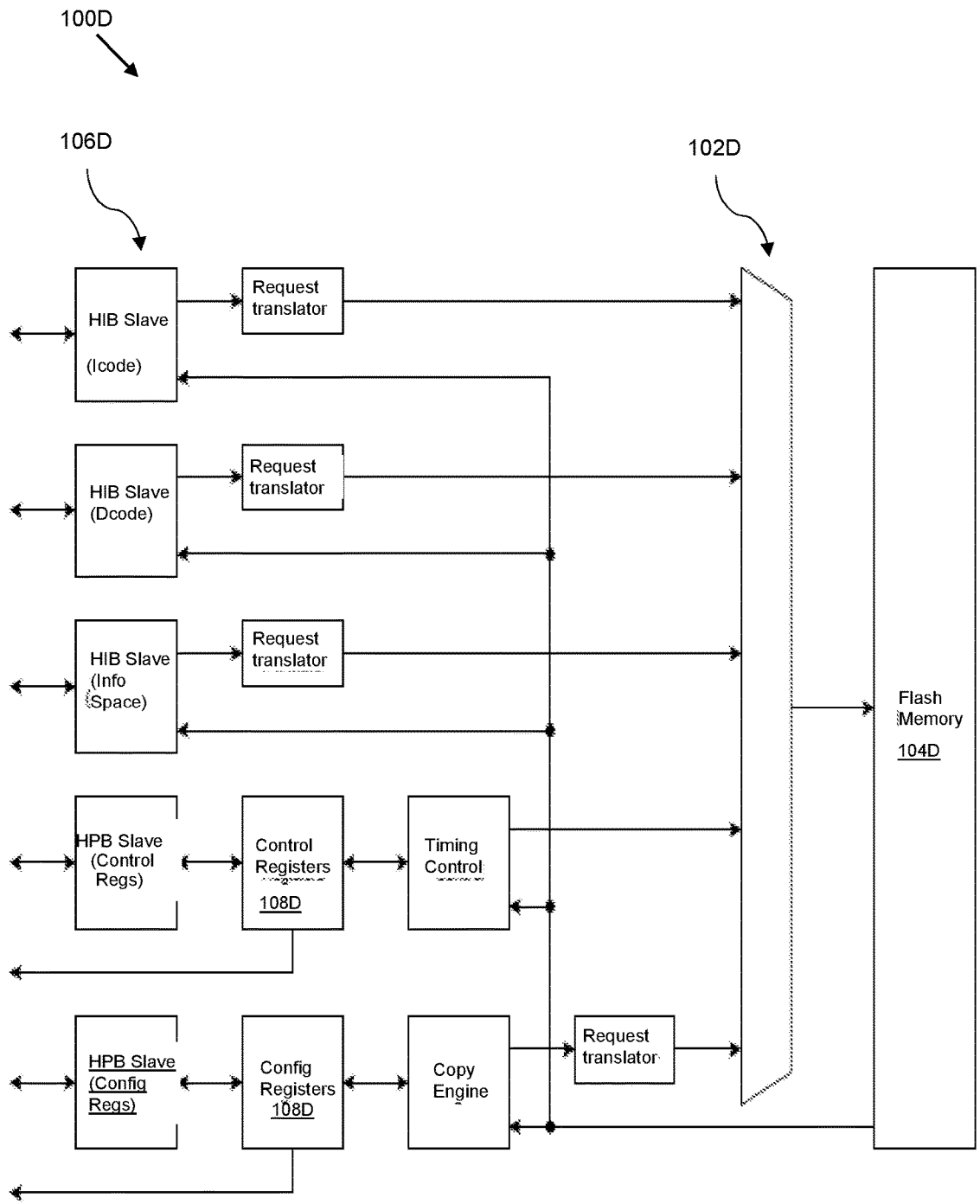

FIG. 1D illustrates one embodiment of a flash memory controller. During normal processing unit code execution, the Flash Memory Controller 102D translates requests from the processing unit (via the Flash cache) and the HIB and HPB (high performance peripheral bus) slaves 106D to the Flash Memory instance 104D for instruction and data fetches. The Controller 102D can be designed to return data to the cache in single wait-state and can operate up to the maximum operating frequency of half the processing unit, or whatever frequency is adapted to the functionality of this block.

The Flash Memory Controller facilitates flash erase and programming operations through the control registers 108D. When erase or programming operations are active, data cannot be fetched from the Flash memory. This will cause the cache controller fill logic to stall until the program operation is complete and the Flash device is available. With the cache enabled, this collision should happen very infrequently. Another function of the Flash Memory Controller is to capture the configuration values which are distributed to the various on-chip peripherals of the microcontroller system at chip power-up. These are read from the Information Space of the Flash Memory and captured in registers to be used by the other peripherals. The configuration values are reloaded each time a full-chip POI cycle occurs.

Similarly, a SRAM Interface translates requests from the processing unit to the SRAM Memory Instances for instruction and data fetches. The Interface is designed to return data in zero wait-states and can operate up to the maximum operating frequency of the processing unit. The Interface contains arbitration logic for each SRAM instance which allows one of 2 bus slaves access to the SRAM on any given cycle.

Figure 1E:
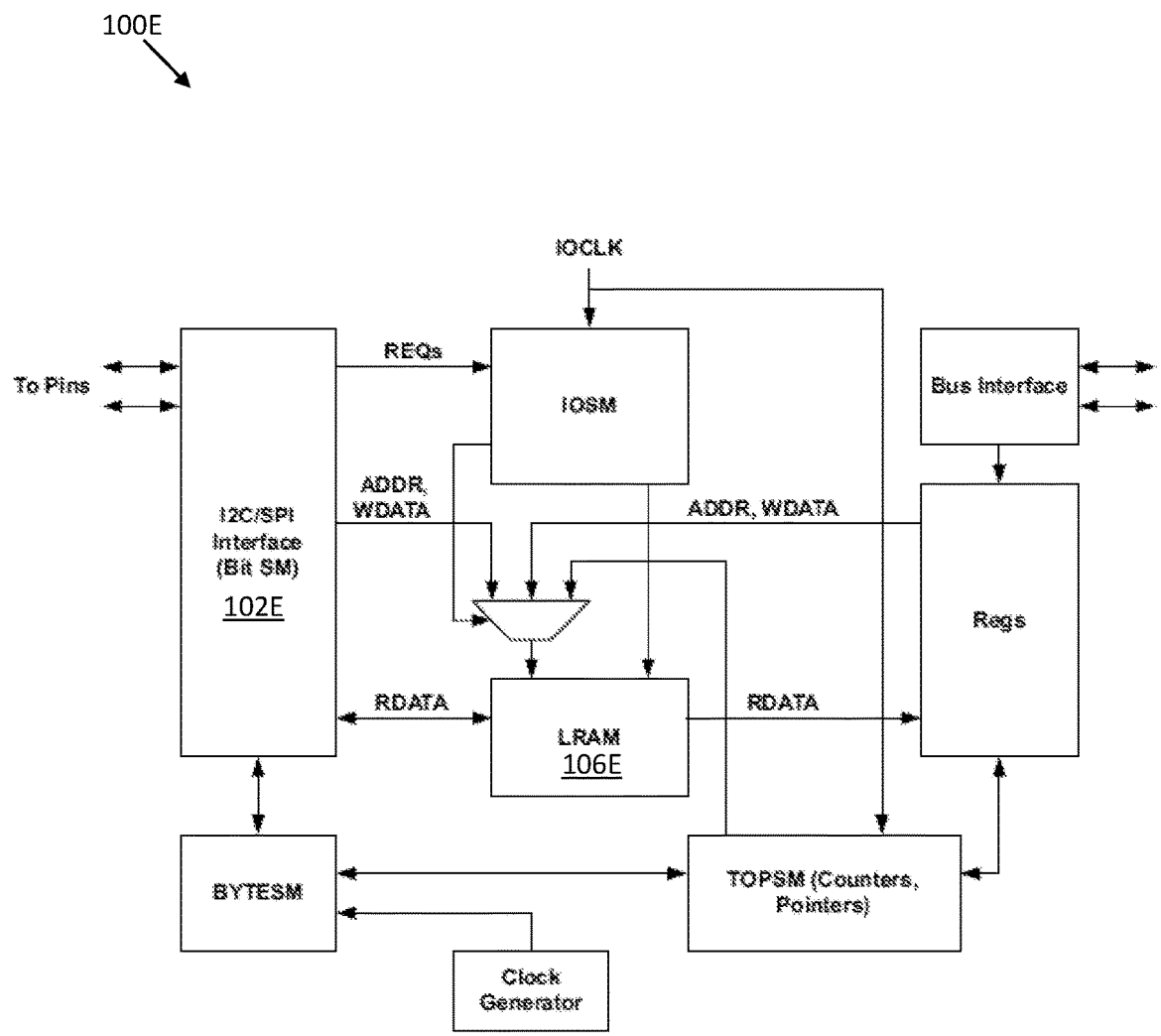

FIG. 1E illustrates one embodiment of a I/O system 100E including multiple I2C/SPI Master Modules. In one embodiment, the microcontroller system may include six I2C/SPI Master Modules, each of which functions as the Master of an I2C or SPI interface as selected by a dedicated register. A 128-byte bidirectional FIFO and a sophisticated Command mechanism allow simple initiation of I/O operations without requiring software interaction.

In one embodiment in I2C mode the I2C/SPI Master supports 7- and 10-bit addressing, multi-master arbitration, interface frequencies from 1.2 kHz to 1.0 MHz and up to 255-byte burst operations. In SPI mode the I2C/SPI Master supports up to 8 slaves with automatic nCE selection, 3 and 4-wire implementation, all SPI polarity/phase combinations and up to 4095-byte burst operations, with both standard embedded address operations and raw read/write transfers.

Figure 1F:
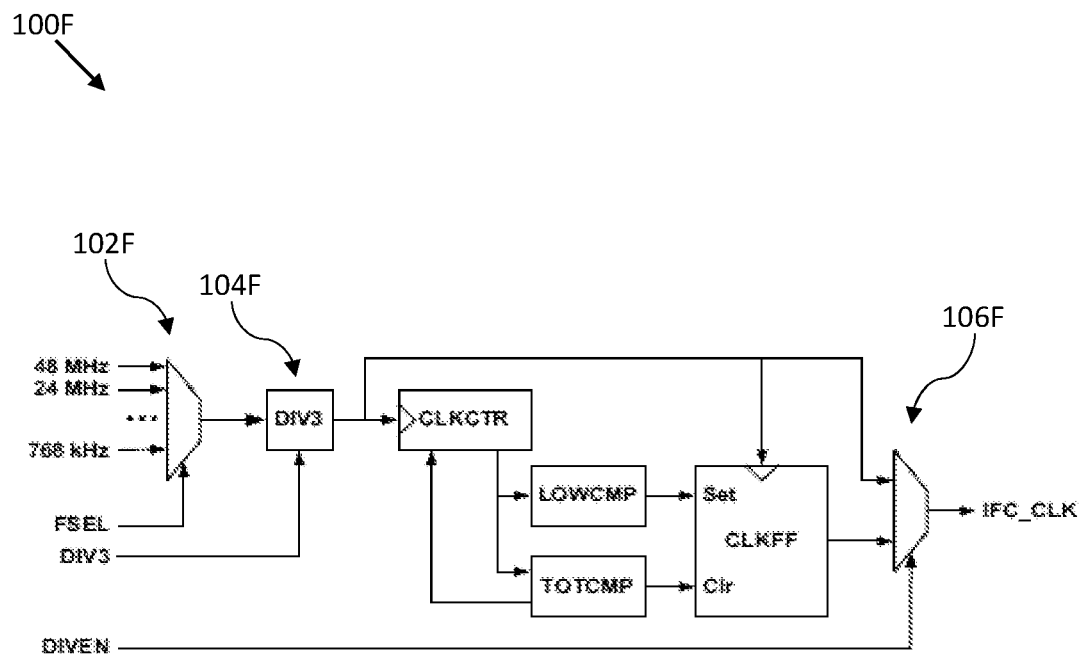

The Microcontroller system can further support four Master SPI ports and two High Speed Master SPI ports As indicated in FIG. 1F, the I2C/SPI Master can generate a wide range of I/O interface clocks. The source clock is a scaled version of the HFRC 48 MHz clock, selected by a bit in the IO Master register. A divide-by-3 circuit may be selected as well in this register, which is particularly important in creating a useful SPI frequency of 16 MHz. The output of the divide-by-3 circuit may then be divided by an 8-bit value to produce the interface clock. This structure allows very precise specification of the interface frequency, and produces a minimum available interface frequency of 1.2 kHz. The clock duty cycle may be specified and adjusted by a register bit.

In order to minimize the amount of time the CPU must be awake during I2C/SPI Master operations, the architecture of the I2C/SPI Master is organized around processing commands which transfer data to and from an internal 128-byte FIFO. A command register includes all necessary controls to perform I2C/SPI data transfers. For writes to the interface, software writes data to the FIFO and then sends a single command to an IOMaster Register. In one embodiment, the Command includes either the I2C slave address or the SPI channel select, the desired address offset and the length of the transfer. At that point the I2C/SPI Master executes the entire transfer, so the processing unit can go to sleep. If more than 128 bytes are to be transferred, the Master will generate an interrupt when the FIFO size value drops below the write threshold so the processing unit can wake up and refill the FIFO. The I2C/SPI Master will generate a command interrupt when the command is complete. In each case, the total number of bytes transferred in each operation is specified in a field of the IO Master Register. If software executes a write to the FIFO when it is full an interrupt will be generated and the transfer will be terminated. For reads, the CMD Register is first written with the command and the processing unit can go to sleep. The Master initiates the read and transfers read data to the FIFO. If the FIFO size value exceeds the read threshold, an interrupt is generated so the processing unit can wake up and empty the FIFO. An interrupt is also generated when the Command completes. If software executes a read from the FIFO when it has less than a word of data another interrupt will be generated and the transfer will be terminated. No interrupt will be generated if the read transfer has already completed, so that software can read the last FIFO word even if it is incomplete.

If the FIFO empties on a write or fills on a read, the I2C/SPI Master will simply pause the interface clock until the CPU has read or written a byte from the FIFO. This avoids the requirement that the thresholds be set conservatively so that the processing unit can wake up fewer times on long transfers without a risk of an underflow or overflow aborting a transfer in progress.

If software initiates an incorrect operation, such as attempting to read the FIFO on a write operation or when it is empty, or write the FIFO on a read operation or when it is full, the Master will generate an error interrupt. If software attempts to write the Command Register when another Command is underway or write the CMD register with a write command when the FIFO is empty the Master will generate an error interrupt.

Each operation is self-contained, and the FIFO pointers are reset at the completion of each operation. For example, it is not possible to load the data from multiple transfers into the FIFO and then execute several CMD register writes.

The I2C/SPI Master can also include a 128-byte local RANI (LRAM) for data transfers. The LRAM functions as a FIFO. Only 32-bit word accesses may be supported to the FIFO from the processing unit. Control bits will be maintained in IOMaster registers to control the read and write operations from the processing unit to the FIFO. Some external peripherals, particularly sensors such as accelerometers and gyroscopes, have multiple registers which hold sample data (2 bytes each of X, Y and Z are common), and FIFOs behind these registers which hold multiple samples. In order to allow software to retrieve several samples with a single operation, the microcontroller system I2C/SPI Master includes the capability to execute the same command multiple times. If multiple commands are desired, a register is loaded with the number of additional times to execute the next command. When a command is written to the Command Register, the command is then executed multiple times, filling or emptying the FIFO as appropriate. The series of repeated commands behaves as if it was a single long command, with a single interrupt occurring at the end and other interrupts occurring if the FIFO crosses the relevant threshold.

For example, assume a peripheral has 6 bytes of sensor sample data located at register offsets 10, 11, 12, 13, 14 and 15. Also assume that the internal FIFO threshold of the peripheral has been set so that an interrupt occurs when the FIFO contains 8 samples. The command register is set to 7, and a read command is executed with an offset of 10 and a length of 6. This command will be executed 8 times, each time bursting 6 bytes of data from registers 10-15 in the peripheral to the I2C/SPI Master FIFO. When the command is received the FIFO in the I2C/SPI Master will contain 48 bytes of data. The bytes of data are packed in the FIFO—there are no gaps between samples.

Each I2C/SPI Master has a global interface enable bit. This bit should be kept at 0 whenever the interface is not being used in order to minimize power consumption.

One particularly useful peripheral 132 accessible via I/O 128 is a Pulse-Density Modulated (PDM) to Pulse-Code Modulated (PCM) peripheral that supports audio applications and accessed via an optional I2S slave interface for external host processor communication. The PDM controller generates the clock output to interface to 1 (mono) or 2 (stereo) PDM-based digital microphones. The PDM input data is sampled on the rising (left/mono) and falling (right/stereo) edges of a PDM clock. The controller supports 16-bit PCM output sampling at 8/16 kHz. The single bit pulse-density modulated (PDM) bit stream data is converted into pulse-code modulated (PCM) data and provides an optional I2S serial audio/voice data format. The converted PCM data is stored in an asynchronous FIFO where is can then be retrieved by the MCU CPU via the HIB slave interface.

The PDM controller can include Stereo or mono PDM input, 16 bit PCM digital output, I2S slave interface output (optional), support for variable PDM output clock rates (750-768 kHz, 1.5-1.536 MHz, 3-3.072 MHz: output clock depends on source clock from I2S or microcontroller system), 64× decimation of PDM bit stream input to PCM output, a sampling rate of 8 kHz or 16 kHz (additional sample rates are supported as needed), and an HIB slave interface for register control, status programming and PCM FIFO data access The microcontroller system may integrate a PDM controller which has two modes of operation: low power mode and normal mode. The low power mode is intended for wake-on-voice/keyword detect operation. A low frequency PDM clock is generated to the microphone (requires digital microphone that supports low power operation). Once a keyword is detected, the microcontroller generates a wake event to enter normal mode. In normal mode, higher PDM frequencies are supported to process audio/voice as needed for voice recording, voice calls, or other audible input.

The PDM-to-PCM core IP converts PDM bit stream data into 16-bit PCM data through internal data sampling, filtering, and PGA amplification. The controller may be operated at stereo or mono mode in normal operation, system reset or power down mode when not in use. Each mode can be programmed through registers.

Figure 1G:
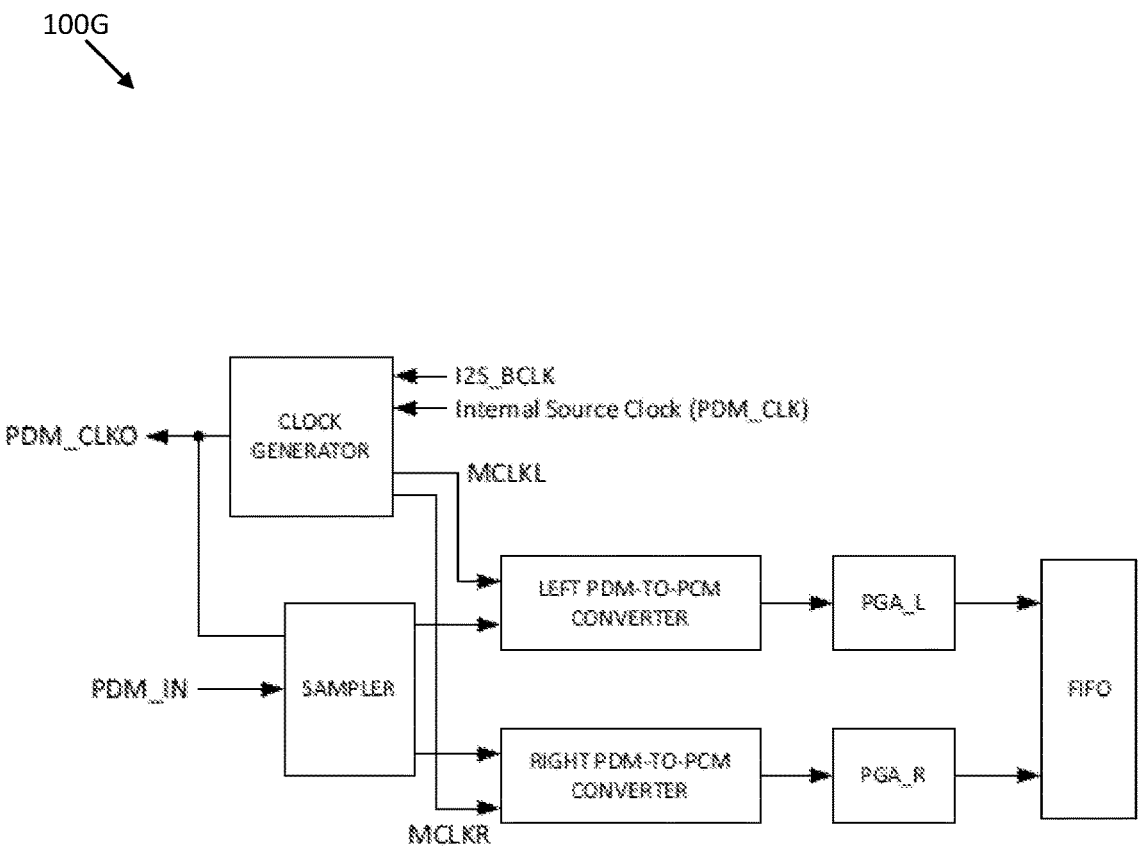

The basic PCM conversion flow is seen in detail in FIG. 1G, where the microcontroller system may support dual-mode clock sourcing for PDM microphone operation. The first mode isclock sourcing from the microcontroller directly (via divided down HFRC reference). The second mode is clock sourcing from an external host via the I2S_BCLK. In one embodiment, clock sources can be switched if a higher accuracy clock is required based on the audio sampling requirements. The microcontroller system clock source is based on a RC oscillator which has intrinsic jitter that affects the quality of the resulting clock. For general voice command processing, the quality of the clock is sufficient. However, for voice recording/playback scenarios, this could manifest as pitch/noise problems. In applications where the microcontroller system is used for voice/keyword detect, upon detection, the microcontroller system can generate notification to the external host. The external host can then send a command to the microcontroller system to switch clock source.

Figure 1H:
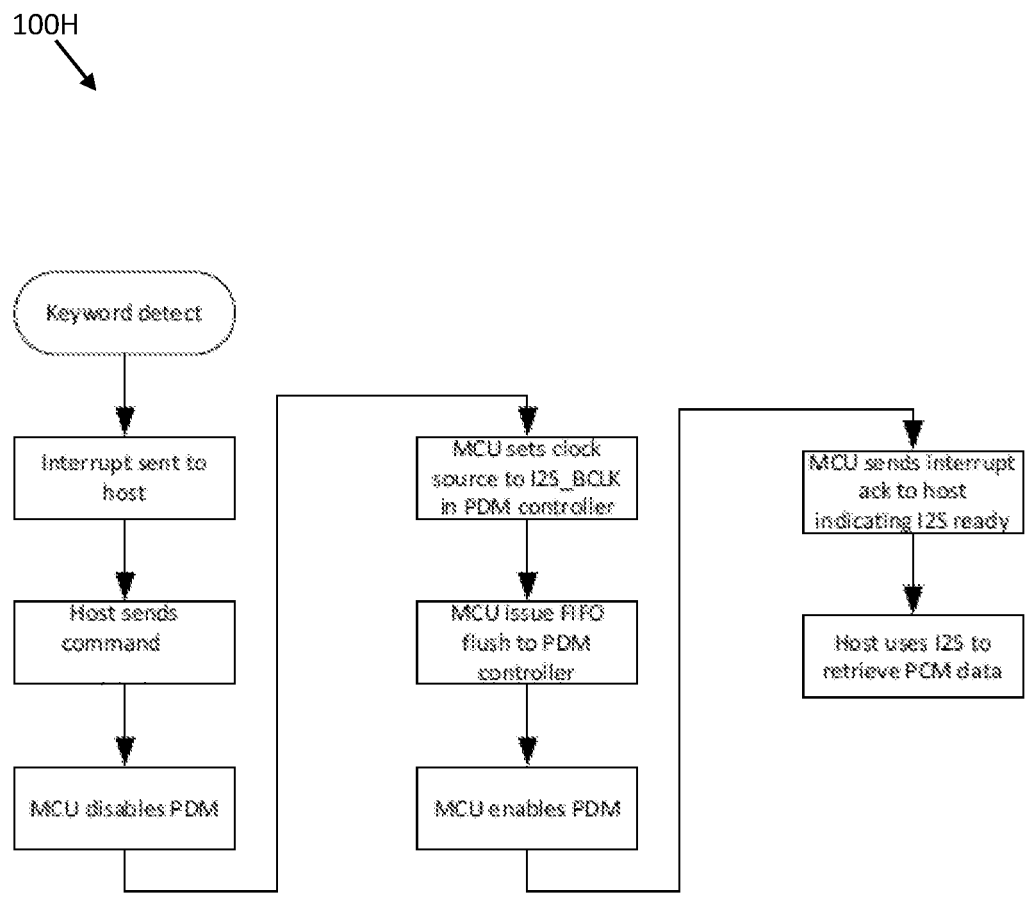

FIG. 1H illustrates an example of how transition to voice/keyword detect can be handled. The PCM data is retrieved from the PDM module through a 256-word FIFO. The FIFO handling is controlled by registers and interrupts when the FIFO limits are reached. The PDM controller supports digital volume control and filtering by controlling the registers associated to the PDM block.

Figure 1I:
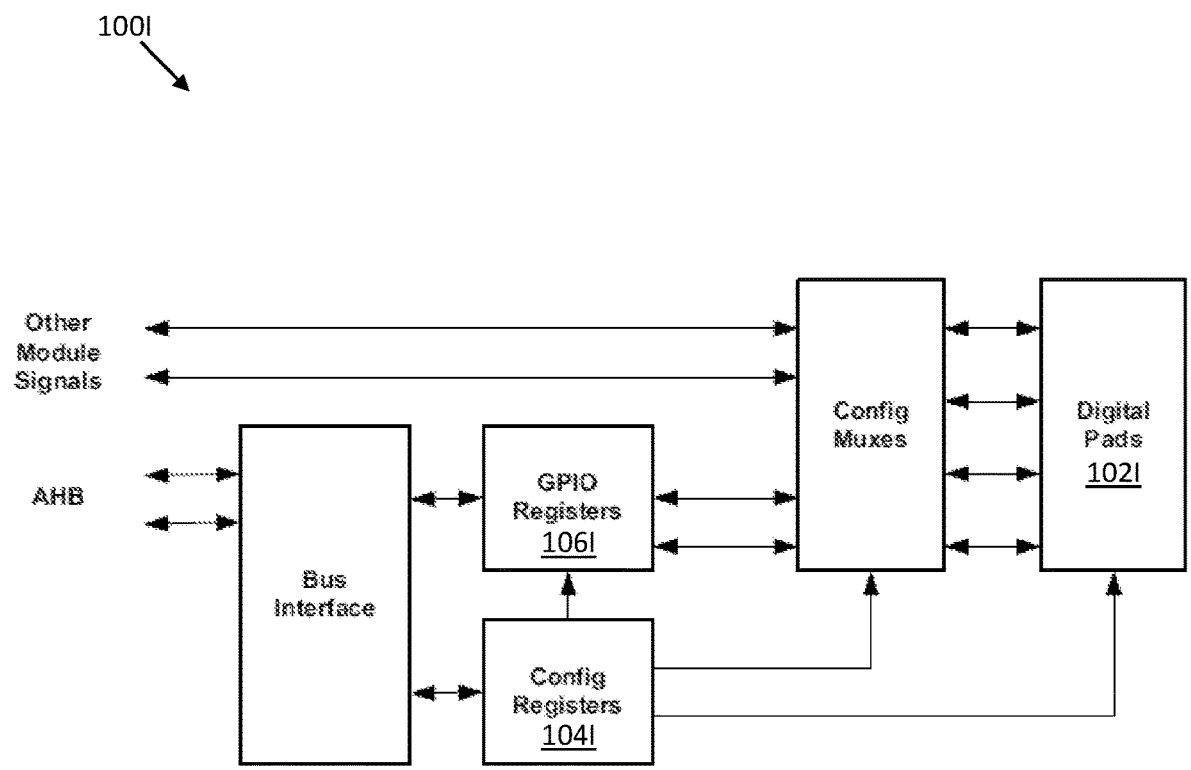

FIG. 1I illustrate a General Purpose I/O and Pad Configuration (GPIO) Module able to controls connection to a set of digital/analog pads. Each pad may be connected to a variety of module interface signals, with all pad input and output selection and control managed by the GPIO module. In addition, any pad may function as a general purpose input and/or output pad which may be configured for a variety of external functions. Each GPIO may be configured to generate an interrupt when a transition occurs on the input. A number of register bits will adjust the characteristics of the pads. Current drive strength, tri-state, pass-through, weak or strong pull-up and pull-down transistors, optional pull-up resistors can be chosen by programming the GPIO registers. Each GPIO pad can be configured to generate an interrupt on a high-to-low transition or a low-to-high transition. Each interrupt is enabled, disabled, cleared or set with a standard set of Interrupt Registers.

Each Counter/Timer can optionally count pulses from an input pad, or generate pulses on an output pad. If the pad is used as an input, a register bit should be set, otherwise it should be cleared. A register bit may be set if the input signal is open drain.

The microcontroller system may have industry standard interface circuitry like I2C, SPI, UART connect to the GPIO pads. Audio signals can be connected to a variety of pads. The PDM CLK and DATA signals may each be connected to several pads. Note that CLK and DATA can be selected independently.

Each pad of the microcontroller system can be configured as a GPIO port by setting a register bit. The flexible clock output of the Clock Generator module (described later), CLKOUT, may be configured on several pads. In addition to the CLKOUT mux output, there is also a dedicated 32 kHz clock output. This clock is primarily for leveraging the 32 kHz oscillator clock from the microcontroller system. This clock output may be configured on several pads.

Three types of pad connections may be made for the ADC module. The ADC reference voltage input may be supplied on a dedicated input pin. If an external digital trigger is desired, a pad may be configured for that purpose.

Two types of pad connections may be made for the Voltage Comparator (VCOMP) module. Three reference voltages may be used for the comparator negative input.

Figure 1J:
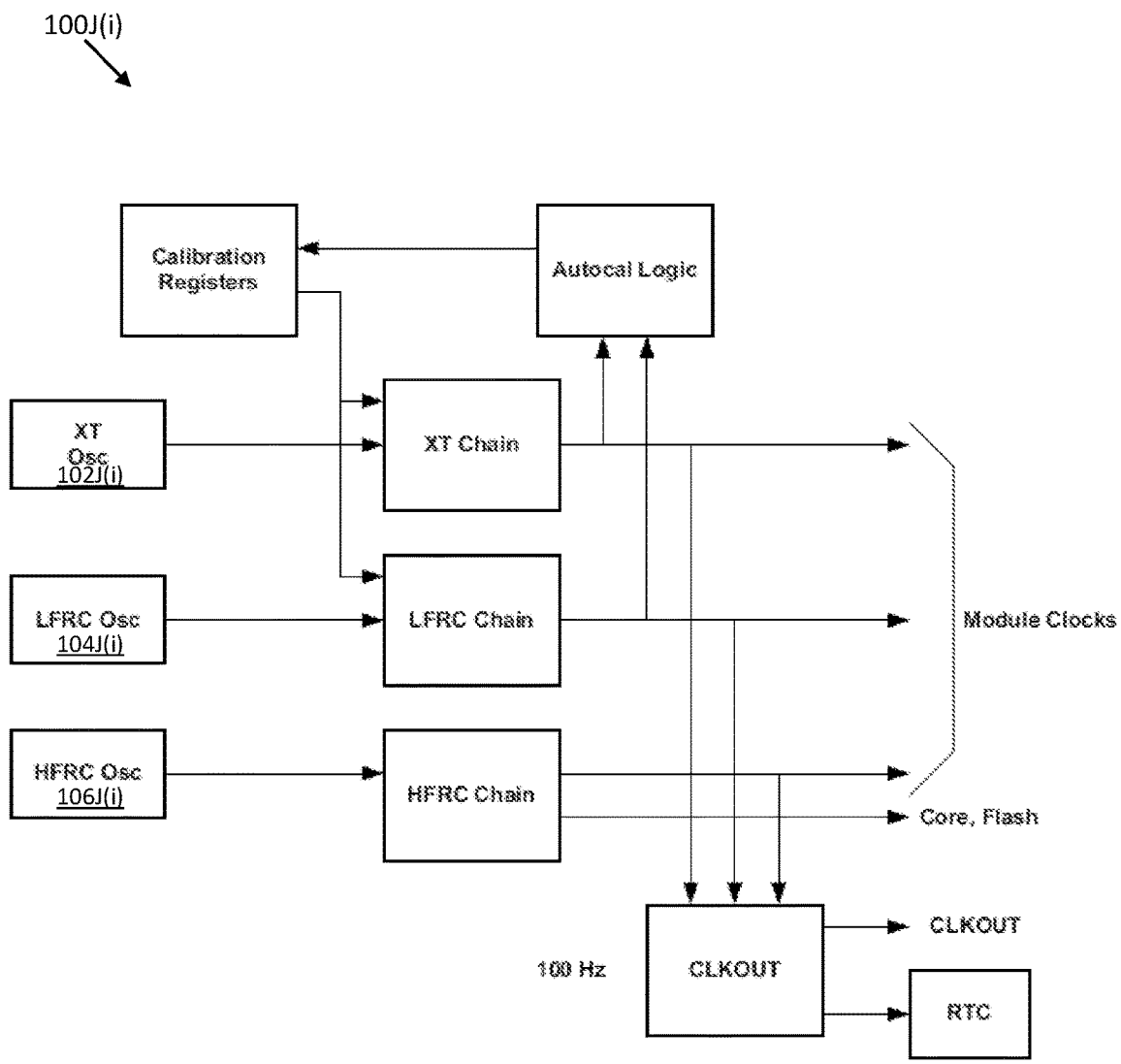

The clock generator 120, illustrated in FIG. 1J(i), supplies clock functionality for the microcontroller system. These clocks may be derived from one of three fundamental clock sources: a high precision crystal controlled oscillator (XT), a low power 1 kHz RC oscillator (LFRC) and a high frequency 48 MHz oscillator (HFRC). A clock CLKOUT, generated from any of the oscillators, may be configured and driven onto an external pin. CLKOUT also drives the Real Time Clock (RTC) Module and other internal clock nodes.

The Clock Generator automatically controls the enabling of the oscillators, so that they are only powered up and used when requested by another module. This allows minimal power consumption without complex software intervention, so that software does not need to manage any enabling or disabling of the oscillators. As an example, an I2C/SPI Master requires the HFRC in order to generate the serial interface clock. If a transfer is initiated and the processor is put into Deep Sleep mode, the HFRC will remain active until the I/O transfer is completed. At that point the HFRC can be powered down without requiring any software intervention.

The low power LFRC, with a nominal frequency of 1024 Hz, is used when short term frequency accuracy is not important. It also supplies clocks for some basic state machines and is always enabled. Calibration logic is included. The LFRC Oscillator may include a design as described in U.S. Pat. No. 8,924,765, titled "Method and apparatus for low jitter distributed clock calibration", and have a distributed digital calibration function similar to that of the XT Oscillator. Because the LFRC Oscillator has a greater fundamental variability, the required range of calibration is much larger. When the 1024 Hz RC oscillator is selected, the clock at the 512 Hz level of the divider chain is modified on a selectable interval using the calibration value CALRC in the REG_CLKGEN_CALRC Register. Clock pulses are either added or subtracted to ensure accuracy of the LFRC. CALRC cycles of the 512 Hz clock are gated (negative calibration) or replaced by 1024 Hz pulses (positive calibration) within every 1024 second calibration period. Each step in CALRC modifies the clock frequency by 1.907 ppm, with a maximum adjustment of +249,954/−249,955 ppm (±25%).

The pulses which are added to or subtracted from the 512 Hz clock are spread evenly over each 1024 second period using the patented Distributed Calibration algorithm. This ensures that in LFRC mode the maximum cycle-to-cycle jitter in any clock of a frequency 512 Hz or lower caused by calibration will be no more than one 512 Hz period (~2 ms). This maximum jitter applies to all clocks in the microcontroller system which use the LFRC. Note that since the 512 Hz LFRC clock is calibrated, the 1024 Hz LFRC is an uncalibrated clock. This may be a useful selection in some cases.

In one embodiment, the LFRC oscillator calibration value can determined by the following process:
1. Set a field "CALRC" to 0 to insure calibration is not occurring.
2. Select the LFRC oscillator
3. Select the LFRC or a division of it on a CLKOUT pad.
4. Measure the frequency Fmeas at the CLKOUT pad.
5. Compute the adjustment value required in ppm
6. Compute the adjustment value Adj
7. Compare Adj value with min/max range
8. If target Adj is within min and max, set CALRC=Adj
9. Otherwise, the LFRC frequency is too low to be calibrated The high accuracy XT Oscillator can be tuned to an external 32.768 kHz crystal, and has a nominal frequency of 32.768 kHz. It is used when frequency accuracy is critically important. Because a crystal oscillator uses a significant amount of power, the XT is only enabled when an internal module is using it. Digital calibration logic is included. The output of the XT oscillator may be digitally calibrated to ±1 ppm (part per million). It should be noted that the XT oscillator is also optional if the requirements of the design can tolerate the internal LFRC/HFRC oscillator specifications. It should also be noted that the microcontroller system can be used to enable tuning, and external capacitors are not required to tune an internal divided clock of the crystal input to achieve a precise scaling of 32.768 kHz.

The XT Oscillator can include a Distributed Digital Calibration function. When the 32 kHz XT oscillator is selected, the clock at the 16 kHz level of the divider chain is modified on a selectable interval using the calibration value CALXT in the related Register. Clock pulses are either added or subtracted to ensure accuracy of the XT. CALXT cycles of the 16 kHz clock are gated (negative calibration) or replaced by 32 kHz pulses (positive calibration) within every 64 second calibration period. Each step in CALXT modifies the clock frequency by 0.9535 ppm, with a maximum adjustment of +975/−976 ppm (±0.1%). The pulses which are added to or subtracted from the 16 kHz clock are spread evenly over each 64 second period using the patented Distributed Calibration algorithm. This insures that in XT mode the maximum cycle-to-cycle jitter in any clock of a frequency 16 kHz or lower caused by calibration will be no more than one 16 kHz period (~60 us). This maximum jitter applies to all clocks in the microcontroller system which use the XT. Note that since the 16 kHz XT clock is calibrated, the 32 kHz XT is an uncalibrated clock.

The XT Oscillator calibration value can be determined by the following process:

1. Set a "CALXT" register field to 0 to insure calibration is not occurring.
2. Select the XT oscillator by setting a register bit to 0.
3. Select the XT or a division of it on a CLKOUT pad.
4. Measure the frequency Fmeas at the CLKOUT pad.
5. Compute the adjustment value required in ppm
6. Compute the adjustment value Adj
7. Compare Adj value with min/max range
8. If target Adj is within min and max, set CALXT=Adj
9. Otherwise, the XT frequency is too low to be calibrated.

If the 32 kHz XT Oscillator generates clocks at less than 8 kHz for a period of more than 32 ins, the microcontroller system detects an Oscillator Failure. An interrupt can be set when an Oscillator Failure occurs, and is also set when the microcontroller system initially powers up. If desired, while the microcontroller system RTC is using the XT Oscillator, it will automatically switch to the LFRC Oscillator on an Oscillator Failure. This guarantees that the RTC clock will not stop in any case. If the XT Oscillator experiences a temporary failure and subsequently restarts, the Microcontroller system will switch back to the XT Oscillator.

The high frequency HFRC Oscillator, with a nominal frequency of 48 MHz, is used to supply all high frequency clocks in the Microcontroller system such as the processor clock for the processing unit, memories and many peripheral modules. Digital calibration may be not supported for the HFRC, but its frequency may be automatically adjusted by an Autoadjustment function that is a combination of analog and digital operations.

The HFRC is enabled only when it is required by an internal module. When the processing unit goes into a sleep mode, the HFRC will be disabled unless another module is using it. If the processing unit goes into deep sleep mode, the HFRC will be powered down when it is not needed. When the HFRC is powered up, it will take a few microseconds for it to begin oscillating, and a few more microseconds before the output is completely stable. In order to prevent erroneous internal clocks from occurring, the internal clocks are gated until the HFRC is stable.

In some applications it is important that the HFRC frequency be more accurate than the ±2% variation typically seen, particularly in cases where the temperature may vary widely. A good example of this is in cases where the Microcontroller system communicates with another device via the UART. The frequency matching with the other device in the connection is an important factor in the reliability of the connection. In order to support a highly accurate HFRC, Autoadjustment can be provided. It should be noted that Autoadjustment is dependent on an accurate clock source such as the crystal. The min/max variation of the HFRC frequency with and without adjustment is different. During Autoadjustment, the number of HFRC cycles which occur in one 32.768 kHz XT Oscillator cycle is compared to a target value. If the count is different from the target, an HFRC tuning value is modified to change the HFRC frequency. Autoadjustment works by periodically enabling the HFRC and the XT, counting the HFRC cycles in a single XT cycle, subtracting that value from a register and adding the resulting difference to the actual HFRC tuning value. The current tuning value may be read back in a Register. Autoadjustment cycles will occur continuously if both the XT and the HFRC are currently requested by other modules. If either oscillator is disabled, Autoadjustment cycles will then occur at intervals determined by a register field. Shorter repeat intervals will result in more accurate HFRC frequencies, especially if the temperature is changing rapidly, but will result in higher power consumption. When an Autoadjustment cycle occurs, if the XT was disabled it is enabled and then a delay occurs to allow the XT to stabilize. Once the HFRC is stable, the HFRC is enabled and several Autoadjustments occur, each of which results in a refinement of the tuning value. Once those adjustments are complete, the HFRC and XT are powered down unless they are in use by other functions.

The Autocalibration logic may be used to measure the frequency of an internal clock signal relative to the XT Oscillator frequency. The following steps are required to perform this measurement:

Set a "ACAL" field to 000.
2. Clear the ACC interrupt flag.
3. Select the clock to be measured with the appropriate register field.
4. Set ACAL to 110.
5. Wait for the ACC interrupt flag to be set.
6. Read a field "ACALCTR" which will contain the number of reference clocks which occurred during one cycle of the XT Oscillator.
7. Calculate the frequency of the measured clock.

The measured frequency is: FMEAS=FREF÷ACALCTR where FREF is the frequency of the reference clock and ACALCTR is the value read from ACALCTR when the measurement is complete. Note that the longer the measurement period is, the more time the measurement takes, but the resulting FMEAS will be more accurate.

Other timers, counters, or clocks that support various clock systems can also be supported. For example, a Real Time Clock (RTC) module requires a 100 Hz clock which is provided by the Clock Generator. This clock may come either from the LFRC or the XT Oscillators, as determined by a register bit. The Real Time Clock (RTC) Module provides an accurate real-time measurement and includes features such as 100th of a second resolution, time measured for the years between 1900 and 2199, automatic leap year calculation, hours may be specified in 12 or 24 hour mode, alarm precise to 1/100 second.

The microcontroller system Timer/Counter module can include four general purpose Timer/Counter pairs, as well as a system timer. Each general-purpose Timer/Counter pair can include two very low power asynchronous 16-bit counters, which may be combined to provide a 32-bit counter. Four registers contain reset values for the counters and/or comparison values to allow the generation of complex signals. Each Timer/Counter has an external pin connection, and can be configured to provide a variety of functions:

Interrupt after a specified delay
Interrupt periodically with a specified period
Determine the time between events Generate an external pulse of a specified width, configurable after a specified delay Generate an external PWM signal with a specified period and duty cycle Count edges on an external input Each pair (AB) of 16-bit counters may be combined to create a 32-bit counter. This configuration is created by setting a register bit for the pair. The control bits for the A counter of the pair are used to control the 32-bit counter, and the B control bits are ignored. The CMPR0 and CMPR1 registers for each 16-bit counter are concatenated to provide the 32-bit comparison values, and all timer modes are supported.

Each timer has the capability to select the processor clock HCLK as the counter clock input. This allows a very straightforward measurement of how much of the time the processor is in a Sleep or Deep Sleep mode. Two counters may be configured so that they count continuously. One is supplied HCLK as its clock, and the other is supplied with a divided version of the HFRC clock. The two counters are enabled simultaneously, and after some period of system operation they are disabled and read. The HFRC count value defines how much real time has elapsed and how many HCLKs could have occurred in that time, and the HCLK count value defines how many actual HCLKs were received in that time. The ratio is an accurate measurement of the percentage of time the CPU is asleep, and is an effective tool for power optimization.

One timer may have a special function which allows it to be used as the sample trigger generator for the ADC. The output of the timer may be sent to the ADC which uses it as a trigger. Typically, this timer is configured in Repeated Count mode for this purpose.

Each counter may be connected to a pulse stream from one of the two Buck Converters. One pulse is generated each time the Buck Converter delivers charge onto the capacitor, and therefore the number of pulses is a good indication of the amount of energy used by the corresponding power domain in a particular time period. Two counters are configured by setting a register bit so that they count continuously. One is supplied a Buck Converter pulse stream as its clock, and the other is supplied with a divided version of the LFRC clock to avoid creating extra power consumption due to the power measurement. The two counters are enabled simultaneously, and after some period of system operation they are disabled and read. The LFRC count value defines how much real time has elapsed, and the Buck Converter count value defines how much energy was consumed in that time.

FIG. 1J(ii) illustrates a System Timer (STIMER) that tracks the global synchronized counter. It can be used for RTOS scheduling and real-time system tracking. This timer is provided in addition to the other timer peripherals to enable software/firmware to have a simple, globally synchronized timer source.

The System Timer (STIMER) Module provides real time measurement for all task scheduling, sensor sample rate calibration, and tracking of real time and calendar maintenance The STIMER includes a single 32-bit counter that keeps track of current time for the application running on the microcontroller system. This counter is reset at the actual power cycle reset of the microcontroller system. It is generally never reset or changed again. Up to eight 32-bit comparator registers can be loaded each of which can generate an interrupt signal.

A Watchdog Timer (WDT) is used to ensure that software is operational by resetting the microcontroller system if the WDT reaches a configurable value before being cleared by software. The WDT can be clocked by one of four selectable prescalers of the always active low-power LFRC clock, but is nominally clocked at 128 Hz. The WDT may be locked to ensure that software cannot disable its functionality, in which case the WDT configuration register cannot be updated. An interrupt can also be generated at a different counter value to implement an early warning function.

The Reset Generator Module (RSTGEN) monitors a variety of reset signals and asserts the active low system reset accordingly. A reset causes the entire system to be re-initialized, and the cause of the most recent reset is indicated by the STAT register.

Reset sources may include an external reset pin (RSTn), a power-on event, a brown-out event, a software request, a watchdog expiration or other desired event.

The active-low RSTn pin can be used to generate a reset using an off-chip component (e.g., a pushbutton).

An integrated power-on detector monitors the supply voltage and keeps the system reset signal asserted while VDD is below the rising power-on voltage, for example VPOR+(1.755 V). When VDD rises above VPOR at initial power on, the reset module will initialize the low power analog circuitry followed by de-assertion of the system reset signal, and normal operation proceeds. The system reset signal is re-asserted as soon as VDD falls below the falling power-on voltage, VPOR-(1.755 V).

An integrated brown-out detector monitors the supply voltage and causes an automatic and non-configurable reset when the voltage has fallen below the 1.755 V threshold, or another threshold as set by a register.

A reset may be generated via software using the processing unit. A second source for the identical software reset functionality can be made available through a register in the Reset peripheral module.

A register enables the capability for software to perform a substantial reset that includes reloading the low power analog circuitry trim settings set in the flash information space.

The Watchdog Timer sub-module generates an interrupt if it has not been properly managed by software within a pre-defined time.

A UART Module maybe added to the microcontroller system and may include the following features such as, to operate independently, allowing the processing unit to enter a low power sleep mode during communication, transmission parameters such as baud rate, data size, parity, stop bit length, to be adjusted. An interrupt generator will optionally send interrupts to the processing unit for transmit, receive and error events.

Figure 1K:
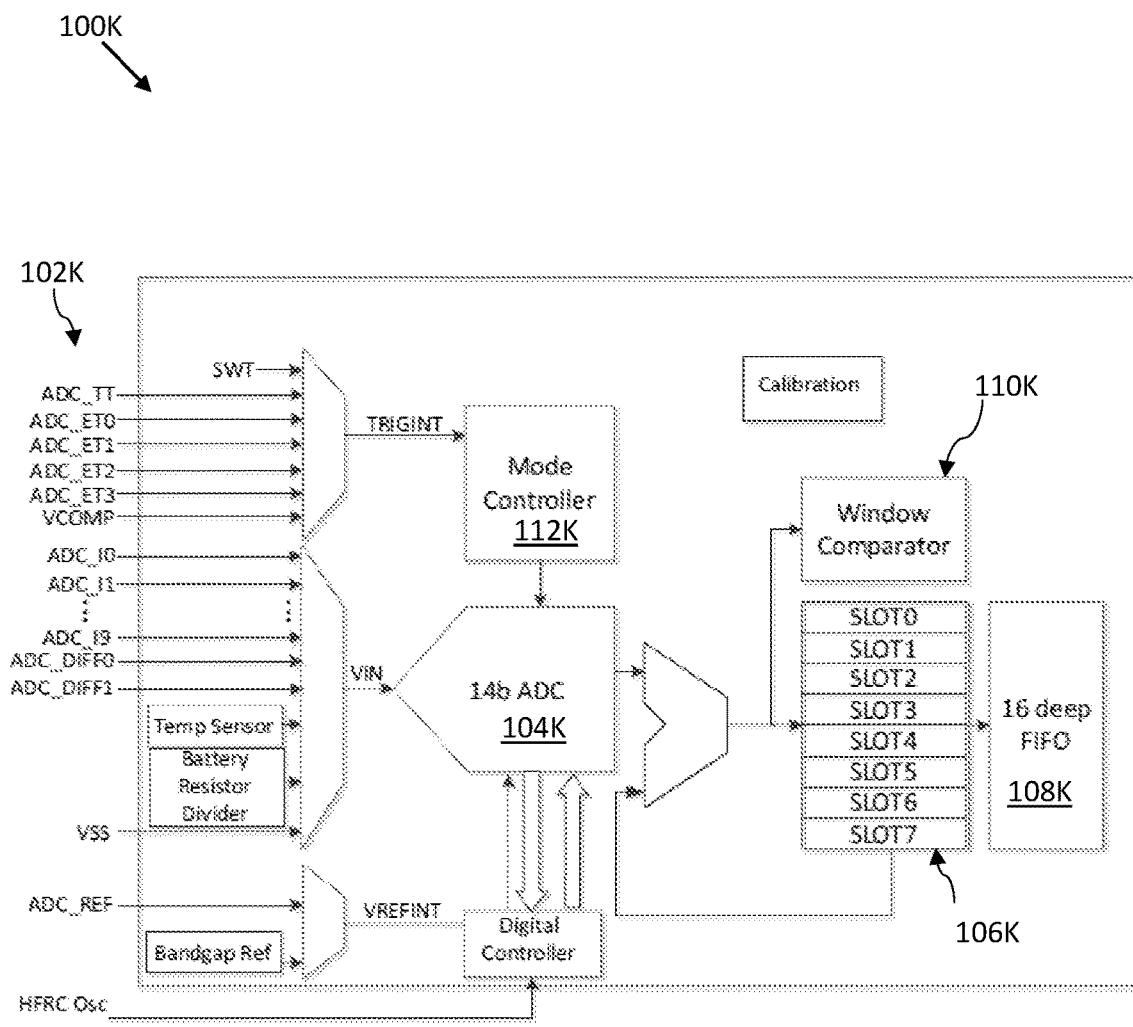

FIG. 1K illustrates one embodiment of an ADC 126A, usable, for example, in conjunction with a temperature or other sensor. A common peripheral for the microcontroller system is an Analog to Digital Converter. The Analog to Digital Converter (ADC) and Temperature Sensor Module may include a 14 bit multi-channel Successive Approximation Register (SAR) ADC as shown in FIG. 1K. Key features may include a 15 user-selectable channels with sources including: External pins, 10 single ended, 2 differential pairs, Internal voltage (VSS), voltage divider (battery), Temperature sensor, Configurable automatic low power control between scans, Optional Battery load enable for voltage divider measurement, configurable for 14/12/10/8 bit ADC Precision Modes, user-selectable on-chip and off-chip reference voltages, Single shot, repeating single shot, scan, and repeating scan modes, User-selectable clock source for variable sampling rates, automatic accumulate and scale module for hardware averaging of samples, a 16-entry FIFO for storing measurement results and maximizing microcontroller system sleep time, window comparator for monitoring voltages excursions into or out of user-selectable thresholds, up to 2.67 MS/s effective continuous, multi-slot sampling rate, and interrupts for FIFO full, FIFO almost full, Scan Complete, Conversion Complete, Window Incursion Window Excursion In one embodiment, the microcontroller system integrates a sophisticated 14 bit successive approximation Analog to Digital Converter (ADC) block for sensing both internal and external voltages. The block provides eight separately managed conversion requests, called slots. The result of each conversion requests is delivered to a 16 deep FIFO. Firmware can utilize various interrupt notifications to determine when to collect the sampled data from the FIFO. This block is extremely effective at automatically managing its power states and its clock sources.

The ADC runs off of the HFRC clock source. When the ADC block is enabled and has an active scan in progress, it requests an HFRC clock source. There is an automatic hardware hand shake between the clock generator and the ADC. If the ADC is the only block requesting an HFRC based clock, then the HFRC will be automatically started. The ADC can be configured to completely power down the HFRC between scans if the startup latency is acceptable or it can leave the HFRC powered on between scans if the application requires low latency between successive conversions. The ADC supports 2 clock frequency modes: 24 MHz and 48 MHz HFRC. 48 MHz mode is the default mode of operation.

As shown in FIG. 1K, the ADC block contains a 15 channel analog multiplexer on the input port to the analog to digital converter. Twelve (12) of the GPIO pins on the microcontroller system can be selected as analog inputs to the ADC through a combination of settings in the PAD configuration registers in the GPIO block and settings in the configuration registers described below.

For 2 analog inputs, these can be configured as a differential pair providing an additional differential pair or up to 2 single-ended inputs from GPIO. The ADC block can be initially triggered from one of six sources. Once triggered, it can be repetitively triggered from counter/timer number three (3). Four of the GPIO pins on the microcontroller system can be selected as trigger inputs. In addition, there is a software trigger and a vcomp trigger source. The trigger sources are as follows, as GPIO pin connection, Voltage comparator trigger (VCOMP) or software trigger (ADC_SWT). The initial trigger source is selected in a trigger field. In addition, one can select a trigger polarity in this register applicable for any of the trigger sources except the software trigger. A number of GPIO pin trigger sources are provided to allow pin configuration flexibility at the system definition and board layout phases of development.

The software trigger is effected by writing to the software trigger register in the ADC block. When the ADC is configured for repeat mode, the initial trigger must be initiated by a software trigger and subsequent scans will be initiated at a repeating rate set by the counter/timer3 configuration.

The microcontroller ADC allows one of two reference sources, each with two different voltage options to be used for the analog to digital conversion step.

The ADC block contains eight conversion slot control registers, one for each of the eight slots. These can be thought of as time slots in the conversion process. When a slot is enabled, it participates in a conversion cycle. The ADC mode controller cycles through up to eight time slots each time it is triggered. For each slot that is enabled, a conversion cycle is performed based on the settings in the slot configuration register for that slot.

As described above, the channel select bit field specifies which one of the analog multiplexer channels will be used for the conversions requested for an individual slot. Each of the eight conversion slots can independently specify: Analog Multiplexer Channel Selection, Participation in Window Comparisons, or Automatic Sample Accumulation The ADC block offers a facility for the automatic accumulation of samples without requiring processing unit involvement. In one embodiment, up to 128 samples per slot can be accumulated without waking the processing unit. This facilitates averaging algorithms to smooth out the data samples. Each slot can request from 1 to 128 samples to be accumulated before producing a result in the FIFO. Each slot can independently specify how many samples to accumulate so results can enter the FIFO from different slots at different rates.

All slots write their accumulated results to the FIFO in exactly the same format regardless of how many samples were accumulated to produce the results. This is a scaled integer format with a 6-bit fractional part. The precision mode for each determines the format for the FIFO data. 14-bit, 12-bit, 10-bit and 8-bit precision modes respectively correspond to 14.6, 12.6, 10.6 and 8.6 formats.

Each slot contains a 21-bit accumulator. When the ADC is triggered for the last sample of an accumulation, the accumulator is cleared and the FIFO will be written with the final average value. When each active slot obtains a sample from the ADC, it is added to the value in its accumulator.

Software accesses the contents of the FIFO through a register. This register may be written by the ADC digital controller simultaneous with the conversion complete interrupt after accumulating the number of samples to average configured for the slot. This register contains the earliest written data, the number of valid entries within the FIFO and the slot number associated with the FIFO data. Thus the interrupt handler servicing ADC interrupts can easily distribute results to different RTOS tasks by simply looking up the target task using the slot number from the FIFO register.

Three other features greatly simplify the task faced by firmware developers of interrupt service routines for the ADC block:

1) The FIFO count bit field is a live count of the number of valid entries currently residing in the FIFO. If the interrupt service routine was entered because of a conversion then this value will be at least one. When the interrupts routine is entered it can pull successive sample values from the FIFO until this bit field goes to zero. This scheme avoids wasteful re-entry of the interrupt service routine. Note that no further I/O bus read is required to determine the FIFO depth.

2) This FIFO has no read side effects. This is important to firmware for a number of reasons. One important result is that the FIFO register can be freely read repetitively by a debugger without affecting the state of the FIFO. In order to pop this FIFO and look at the next result, if any, one simply writes any value to this register. Any time the FIFO is read, then the compiler has gone to the trouble of generating an address for the read. To pop the FIFO, one simply writes to that same address with any value. This give firmware a positive handshake mechanism to control exactly when the FIFO pops.

3) When a conversion completes resulting in hardware populating the 12th valid FIFO entry, a FIFO 75% full interrupt status bit will be set. When a conversion completes resulting in hardware populating the 8th valid FIFO entry, the FIFOOVR2 interrupt status bit will be set. In a FIFO full condition with 16 valid entries, the ADC will not overwrite existing valid FIFO contents. Before subsequent conversions will populate the FIFO with conversion data, software must free an open FIFO entry by writing to the FIFO Register or by resetting the ADC by disabling and enabling the ADC using the ADC config register.

A window comparator is provided which can generate an interrupt whenever a sample is determined to be inside the window limits or outside the window limits. These are two separate interrupts with separate interrupt enables. Thus one can request an interrupt any time a specified slot makes an excursion outside the window comparator limits. The window comparison function also has an option for comparing the contents of the limits registers directly with the FIFO data (default) or for scaling the limits register depending on the precision mode selected for the slots.

Firmware has to participate in the determination of whether an actual excursion occurred. The window comparator interrupts set their corresponding interrupt status bits continuously whenever the inside or outside condition is true. Thus if one enables and receives an "excursion" interrupt then the status bit can't be usefully cleared while the ADC slot is sampling values outside the limits. That is, if an excursion interrupt is received and clears the status bit, it will immediately be reset if the next ADC sample is still outside the limits. Thus firmware should reconfigure the interrupt enables upon receiving an excursion interrupt so that the next interrupt will occur when an ADC sample ultimately goes back inside the window limits. Firmware may also want to change the windows comparator limit at that time to utilize a little hysteresis in these window comparator decisions.

The determination of whether a sample is inside or outside of the window limits is made by comparing the data format of the slot result written to the FIFO with the 20 bit window limits. An ADC sample is inside if the following relation is true: Lower Limit<=ADC SAMPLE<=Upper Limit Thus setting both limits to the same value, say 700.0 (0x2BC<<6=0xAF00), will only produce an inside interrupt when the ADC sample is exactly 700.0 (0xAF00). Furthermore, note that if the lower limit is set to zero (0x00000) and the upper limit is set to 0xFFFFF then all accumulated results from the ADC will be inside the window limits and no excursion interrupts can ever by generated. In fact, in this case, the incursion interrupt status bit will be set for every sample from any active slot with its window comparator bit enabled. If the incursion interrupt is enabled, then an interrupt will be generated for every such sample written to the FIFO.

The window comparator limits are a shared resource and apply to all active slots which have their window comparator bits enabled. If window limits are enabled for multiple enabled slots with different precision modes, the window comparison function can be configured to automatically scale the upper and lower limits value to match the corresponding precision mode format for the enabled slots through the dedicated register.

The mode controller of FIG. 1K is a sophisticated state machine that manages not only the time slot conversions but also the power state of the ADC analog components and the hand shake with the clock generator to start the HFRC clock source if required. Once the various control registers are initialized, the processing unit can go to sleep and only wake up when there are valid samples in the FIFO for the interrupt service routine to distribute. Firmware does not have to keep track of which block is using the HFRC clock source since the devices in conjunction with the clock generator manage this automatically. The ADC block mode controller participates in this clock management protocol.

From a firmware perspective, the ADC mode controller is controlled from bit fields in the ADC configuration register and from the various bit fields in the eight slot configuration registers. The most over-riding control is the ADC enable bit in the register of the power control block. This bit must be set to '1' to enable power to the ADC subsystem. Furthermore, the ADCEN bit in the ADC configuration register is a global functional enable bit for general ADC operation. Setting this bit to zero has many of the effects of a software reset, such as resetting the FIFO pointers. Setting this bit to one enables the mode controller to examine its inputs and proceed to autonomously handle analog to digital conversions.

An ADC scan is the process of sampling the analog voltages at each input of the ADC following a trigger event. If the ADC is enabled and one or more slots are enabled, a scan is initiated after the ADC receives a trigger through one of the configured trigger sources. An application may use the ADC in one of three power modes. Each mode has different implications from overall energy perspective relative to the startup latency from trigger-to-data as well as the standby power consumed.

Figure 1L:
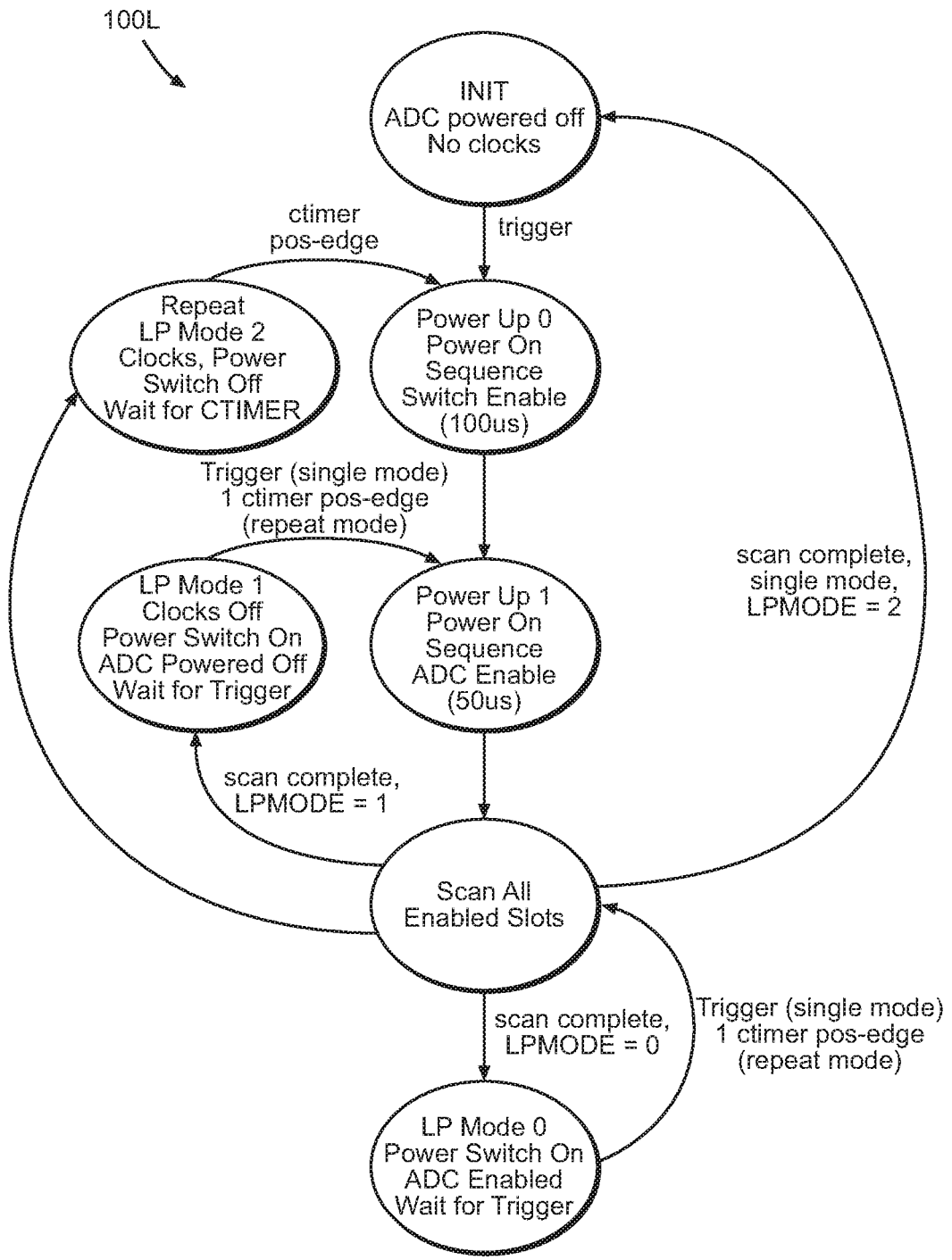

As seen with respect to a state diagram 100L in FIG. 1L, a Low Power Mode 0 enables the lowest latency from trigger to conversion data available. This mode leaves the reference buffer powered on between scans to bypass any startup latency between triggers 1.

Low power mode 1 is a power mode whereby the ADC Digital Controller will automatically power off the ADC clocks, analog ADC and reference buffer between scans while maintaining ADC calibration data. This mode may operate autonomously without processing unit interaction, even while the processing unit is in sleep or deep-sleep mode for repeat mode triggers or hardware triggers. While operating in this mode, the ADC Digital Controller may be used to burst through multiple scans enabling max sample rate data collection if the triggers are running at a rate at least 2× the maximum sample rate until the final scan has completed. When a scan completes without a pending trigger latched, the ADC subsystem will enter a low power state until the next trigger event.

If desirable, for applications requiring infrequent conversions, software may choose to operate the ADC in Low Power Mode 2, allowing the full ADC Analog and Digital subsystem to remain completely powered off between samples. In this use case, the software configures the power control ADC enable register followed by configuring the ADC slots and the ADC configuration register between conversion data collections, followed by disabling the ADC in the power control ADC enable register. Although this mode provides extremely low power operation, using the ADC in this mode will result in a cold start latency including reference buffer stabilization delay and a calibration sequence 100's of microseconds, nominally. In this mode, the ADC must be reconfigured prior to any subsequent ADC operation.

The ADC has 6 interrupt status bits with corresponding interrupt enable bits, as follows: Conversion Complete Interrupt, Scan Complete Interrupt, FIFO Overflow Level 1, FIFO Overflow Level 2, Window Comparator Excursion Interrupt (a.k.a. outside interrupt), and Window Comparator Incursion Interrupt (a.k.a. inside interrupt)

There are two interrupts based on the fullness of the FIFO. When the respective interrupts are enabled, Overflow 1 fires when the FIFO reaches 75% full, viz. 6 entries. Overflow 2 fires when the FIFO is completely full. When enabled, the conversion complete interrupt fires when a single slot completes its conversion and the resulting conversion data is pushed into the FIFO. When enabled, the scan complete interrupt indicates that all enabled slots have sampled their respective channels following a trigger event.

When a single slot is enabled and programmed to average over exactly one measurement and the scan complete and conversion complete interrupts are enabled, a trigger event will result in the conversion complete and scan complete interrupts firing simultaneously upon completion of the ADC scan. Again, if both respective interrupts are enabled and a single slot is enabled and programmed to average over 128 measurements, 128 trigger events result in 128 scan complete interrupts and exactly one conversion complete interrupt following the 128 ADC scans. When multiple slots are enabled with different settings for the number of measurements to average, the conversion complete interrupt signifies that one or more of the conversions have completed and the FIFO contains valid data for one or more of the slot conversions.

Figure 1M:
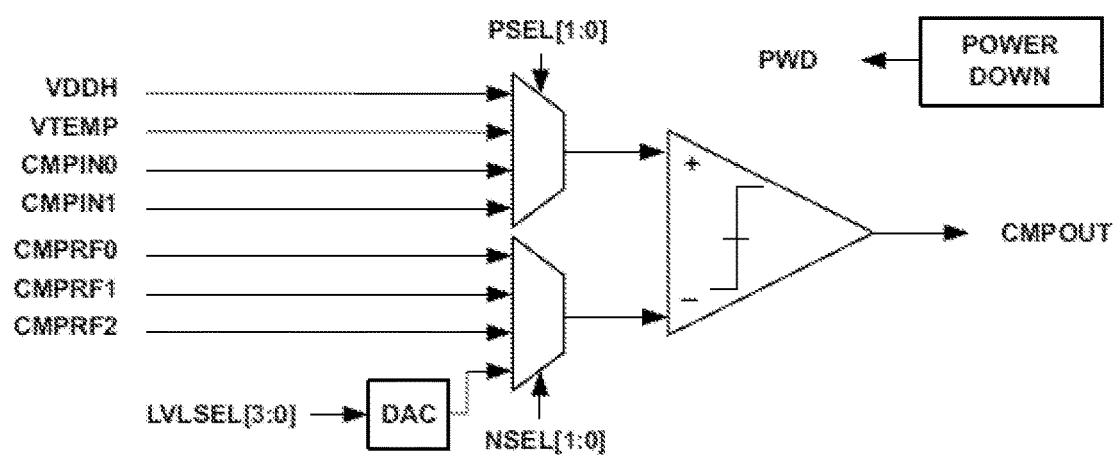
Figure 1N:
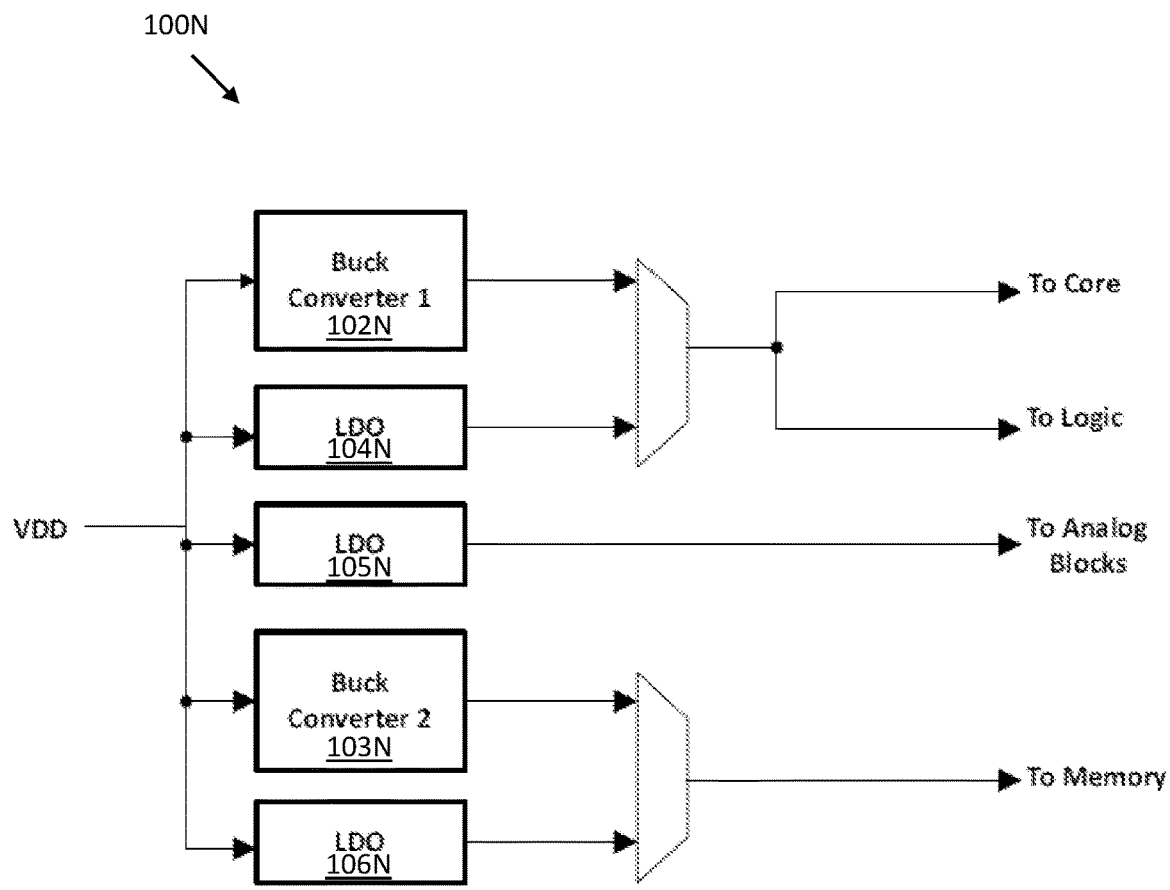

In one embodiment, the voltage regulator 118 can connected to a voltage comparator module such as described with respect to FIG. 1M. The Voltage Comparator Module measures a user-selectable voltage at all times. It provides interrupt and software access to the comparator output with multiple options for input and reference voltages. It can be configured to generate an interrupt when the monitored voltage rises above a user-configurable threshold or when the monitored voltage drops below a user-configurable threshold.

The voltage to be monitored is selected by programming the comparator's positive terminal signal, it can be any of the supply voltage, the temperature sensor output, two external voltage channels. The reference voltage is selected by programming the comparator's negative terminal, and may be any of: 1) three external voltage channels, or 2) the internally generated reference. The internal reference voltage is tuned using an on-chip DAC with level select signal. The Voltage Comparator output will remain high while the voltage at the positive input is above the voltage at reference input. The output will transition low when the voltage at the positive input to the comparator falls below the reference input taking into account hysteresis. The Voltage Comparator output is directly accessible by software by reading a field in the status register. An interrupt will be set if enabled and the Voltage Comparator output transitions high or if it is high at the time the interrupt is enabled. Similarly, an interrupt will be set if enabled and the Voltage Comparator output transitions low or if it is low at the time the interrupt is enabled. The Voltage Comparator Module may be powered off by writing a dedicated register. The voltage regulator 118 can include multiple types of voltage converters as indicated with respect to FIG. 1N. The Voltage Regulator Module down-converts and regulates the supply voltage, VDD, with extremely high efficiency. A pair of Buck Converters enables down-conversion from the power supply input (e.g., a battery) at efficiency of >90%. With ultra-low quiescent current, the Buck Converters are optimized for low power environments. There are also integrated low dropout linear regulators which are used in very low power modes and can also be utilized to provide a lower cost system solution by eliminating the need for the external capacitors/inductors required in buck mode.

The Buck Converters and LDOs of the Voltage Regulator Module are tightly coupled to the various low power modes in the microcontroller system. When the microcontroller system enters deep sleep mode, the Buck Converters can be optionally powered down and bypassed, and either the LDOs or Buck Converters can be placed in an extreme low power mode with only nanoamps of quiescent current.

In various described embodiment, sub or near-Vt transistors were used in described circuitry. Sub or near-Vt circuits are also typically more sensitive to environmental or processing variations than conventional super-Vt circuits. Environmental changes such as temperature and power supply voltage variations, intrinsic variations due to electrical noise, intrinsic variations from one transistor to another due to processing variations, can have a strong impact on the performance of the circuit.

To reduce these process variations, a number of techniques can be used, including use of longer gate lengths and wider transistor width. Minimum gate length and transistor width devices are typically avoided for circuits designed for near or sub-Vt operation. While this reduces peak circuit processing speed, it reduces variation and leakage.

If detailed information related to die level processing conditions are available, the behavior of circuits can be adjusted to maintain circuit conditions within the process corner. Process corner characteristic of a given die can be determined by process control monitors, which test a die during the manufacturing phase. The process corner information can be then stored inside the die in a non-volatile register. Alternatively, existing circuits present on the die can be used for runtime or built-in self testing to determine process corner characteristics.

As one example, a ring oscillator can be monitored during the manufacturing phase, with frequency analyzed under various voltage conditions, and process corner information extracted. As another example, the ADC can be used to measure precisely the threshold voltage of devices placed in the chip for that purpose. That information can be used to determine the optimum supply voltage and circuit bias of internal components, banks, or modules running at discrete voltages.

Environmental conditions such as die temperature can also be measured to allow, for example, the dynamic adjustment of circuit operation frequency, supply voltage, body bias voltage, or other key parameters to remain operational. A CPU can include a temperature sensor that functions by monitoring the voltage across a diode or diode mounted transistor, and that information is usable to adjust circuit voltage biasing and frequency parameters. Specific circuit configuration can create a CTAT characteristics ("Complementary To Absolute Temperature") (as described in U.S. patent application Ser. No. 15/516,883 the disclosure of which is hereby incorporated herein by reference) to offset or adjust temperature effect in a voltage reference, and either approach a zero temperature coefficient or create a voltage reference with a CTAT characteristic, so that sub-Vt and near Vt circuits can operate optimally at constant frequency across temperature Typical circuit quantities that could be adjusted include internal supplies, voltage references, body biases, current references, clock frequencies, and trim settings used to modify circuit behavior. Since external voltage fluctuations and variations can be high for battery powered circuits, internal voltage regulators (buck converters or low drop out (LDO) converters) can be used to reduce variations. The foregoing disclosed monitoring and the temperature tracking techniques can be used by the LDO and buck converter controls (i.e. regulators) to adjust the internal voltage supplies used inside the microcontroller.

Use of multiple transistor types to improve power usage and reduce variations is also contemplated. Such transistor types can include conventional thin oxide and thick oxide, n-channel and p-channel devices of various dopant levels, size, gate width, and threshold voltage options. Semiconductor fabrication facilities often offer High Voltage and Low Voltage transistor designs, with High Voltage designs having larger transistor sizes and greater gate oxide thickness. Semiconductor fabrication facilities may also offer various transistors with different threshold voltages, or $V_t$. Each type of transistor can be characterized for a given die using a process monitor, which determines where a type of transistor is, within a range of process conditions. The supply voltage for a given transistor block is typically adjusted based on the weighted characterization of all these transistors, with those most critical to transistor block functionality given greater weight. These weights can be determined during the design and manufacturing phase. Typically, for active power reduction, more importance will be assigned to Low Vth devices. A look up table can be created to enter the difference transistors characteristics and output the desired supply voltage value.

In some embodiments, these voltages or other quantities can be adjusted dynamically during active modes of operation, and stored during sleep modes. This ensures that a system waking up from sleep mode does not require re-initialization for immediate operation. For example, in a typical low power system, the system alternates between wake and sleep periods. During a wake period, the system can be configured via a register to step to a new frequency/voltage set point upon waking from the next sleep period. After the system goes to sleep, the voltage generators and clock generators go into a sleep mode. When the system exits sleep mode and enters active mode, the clock and voltage generators can be set to the new voltage/frequency set points specified by a register.

Power consumption can be reduced by supporting functional and operational partitioning of different blocks of the microcontroller with respect to critical need such as active power, leakage and/or speed. Active power is the result of signals switching, typically driven by a clock. Leakage power is the result of static conditions that result in power consumption, like the junctions of transistors biased at a given voltage. It can also be intentional current due to the creation of bias voltages in analog circuits. Speed refers to how fast signals are switching, typically related to the clock frequency of a particular circuit.

This results in 8 possible domains. In one case, for circuitry which is neither active power critical, leakage power critical nor speed critical, the choice of supply and Vth used is inconsequential. In another case, which is speed critical but not active power critical nor leakage power critical, a high supply combined with the usage of low Vth transistors is preferred. In yet another case, which is leakage power critical but not active power critical nor speed critical, a low supply combined with the usage of high Vth transistors is preferred. In yet another case, which is leakage power critical and speed critical, but not active power critical, a high supply combined with the usage of high Vth transistors is preferred. In yet another case, which is active power critical but not leakage power critical nor speed critical, a low supply voltage combined with the usage of high Vth transistors is preferred. In yet another case, which is active power critical and speed critical, but not leakage power critical, a low supply voltage combined with the usage of low Vth transistors is preferred. In yet another case, which is active power critical and leakage power critical, but not speed critical, a low supply voltage combined with the usage of high Vth transistors is preferred. In yet another case, which is active power critical, leakage power critical and speed critical, a low supply voltage combined with the usage of low Vth transistors is preferred.

It is to be noted that some manufacturers offer more than 2 choices of Vth, it is not uncommon to see manufacturing processes with 6 Vth options. In this case the architectural choices can be further enhanced by quantifying, usually through simulations, the relative weight of each option, but the trend toward a high or low Vth choice remains as described in the previous paragraph.

For domains that are only speed critical, a high supply combined with a low Vth choice enables the fastest speed. Domains that are rarely used, or that have a small number of gates, such JO control, could be among these.

For domains that are only leakage power critical, the supply can be low while most of the circuitry can use high Vth transistors. Some of the circuitry that remains on at all times (so called "always-on") fits into this category.

For domains that are leakage power and speed critical, a high supply is beneficial for speed, and transistors should be of the high Vth type to minimize leakage. Some of the always-on circuitry fits into this category.

Circuits that are only active power critical would use a low supply and high Vth.

Circuits that are active power and speed critical would preferably use low supply and low threshold transistors. To minimize leakage power, these circuits are often power gated, as discussed in relation with FIG. 4. Processing cores, IO control could fit into this category.

Circuits that are active power and leakage power critical could use a low supply and high voltage devices. A Real Time Clock ("RTC") in a clock generator with a 32 KHz oscillator would be an example.

Circuits that are critical in these areas are preferably designed with both low threshold transistors and reliability under conditions of low voltage supply. The clock generator for the MCU would fit into this category.

Some manufacturers also offer the option of independent control of the substrate and well of the n-channel and p-channel transistors, respectively, as in silicon on insulator (SOI) technologies. With such technologies circuits can be modulated and threshold voltages modified by biasing the substrate or well of the transistors, in a technique generally known as body biasing. In a leakage power critical case a body bias can be "reverse", i.e. a negative voltage for a n-channel transistor, to increase the Vth. In a speed critical circuit transistors can have a forward bias on their body, to lower the Vth. A further advantage of body biasing can be the use of dynamic biasing, where, depending on temperature and processing characteristics, actual biasing voltage is modified. This can be particularly useful if a circuit has 2 or more modes of operations, which require different degree of power criticality. The same circuit can then be biased with a reverse body bias during a low leakage operation, but with a forward body bias during a high speed operation.

Furthermore, workload can be considered when choosing Vth usage, as a high workload will require larger current drive and benefit from low Vth devices. Workload can be established as has been described in "Method and Apparatus for Monitoring Energy Consumption" U.S. patent application Ser. No. 14/918,437, the disclosure of which is hereby incorporated by reference "

Functional blocks can include different circuitry elements with different requirements, all of which can be optimized concurrently. A functional block may also have a mix of transistors with different threshold voltages within one power domain. Functional block can also be manufactured to support multiple power domains. Note however, for many applications it is preferable to use one type of threshold voltages within one power domain. This increases uniformity, simplifies process variation tracking and improves timing control. For example, two domains sharing a synchronous clock are preferably manufactured to use the same transistor types.

A particular transistor block that can particularly benefit from low power operation, with or without near or sub Vt circuit operation, is the so-called "always-on circuit". It generally has multiple functions within the chip including:

Watching for on-chip interrupts from timers, etc. that may request that the system wake up (i.e., the wake-up interrupt controller—WIC)

Watching all I/O to see if off-chip components are requesting that the system wake up (i.e., the GPIO module)

Timekeeping using a low frequency clock (i.e., the Real Time Clock (RTC), and timers)

Managing the power control state machines (e.g., the state of the power switches and voltage regulators), which control which block is power gated, in sleep or active mode.

Reset circuitry which is monitoring voltage levels and various digital sources that can request a reset Storage and distribution of certain key chip configuration bits that are distributed all over the chip (i.e., the MCU control block)

Debug circuitry that allows an off-chip debugger to request a power up event at any time The always-on circuitry is typically divided between a domain using a lower regulated voltage (e.g., 0.9V) and a domain using the unregulated battery voltage.

Because of its high power usage, the CPU or similar logic processing core can benefit from being organized and designed for low power operation, with or without near or sub-Vt circuit operation. Examples of components that can be embedded are, for processing units, of course, digital cores such as ARM™ cores, but also DSP or FPGA cores. Specific processing units can be embedded, such as logic engines dedicated to encryption/decryption, or compression. Processing cores can take different approaches, from traditional computer architecture (CISC, RISC) to neural networks.

Low power systems can also benefit from power regulation of memory blocks and sub-blocks. Typically, an MCU is connected to one or two types of memory, usually one volatile and requiring continuous power to retain memory state (e.g. SRAM), and one non-volatile, that does not require power for long term memory state maintenance (e.g. flash). In order to reduce power, SRAM can be split into multiple blocks, each with different properties and independent controls. For example, in one embodiment a group of SRAM can be placed near the processing units and operate at very high speed. It may be a smaller density SRAM group which is able to access data, in read or write mode, at a faster rate than other SRAM groups in the MCU. The smaller density group can also be designed to operate at a higher supply voltage. In another embodiment a large SRAM block can be divided into smaller SRAM block, each with its own supply. During retention mode, the supplies can be adjusted individually based on the pre-determined safe retention level for every SRAM block. This ensures a lower deep-sleep power than what an equivalent size large SRAM block would consume. The non-volatile memory may be slower to access and require multiple clock cycles. It is then advantageous to use a cache memory to buffer and temporarily store some of the non-volatile memory data and interface with the processing core. The non-volatile memory can operate at a lower voltage to minimize power consumption on a relatively large block, while the cache can operate a higher voltage to optimize speed of execution.

In one embodiment, all SRAM blocks can each have an internal supply voltage control, with a voltage converter and regulator (a buck converter or LDO—Low Drop Out converter) for each block. A register can be assigned to each voltage converter and regulator to assign specific voltage values to the SRAM block during the different mode of operations. So, for illustration, three separate voltage values could be assigned for regular active read, fast active read and retention mode. The proper values can be determined during manufacturing, testing each individual SRAM block. Current consumption can be reduced with this technique. In retention mode, where each block retention voltage depends on the property of a few SRAM bit cells, using the lowest possible voltage for each SRAM block will result in the lowest power consumption.

In other embodiments, SRAM or other memory blocks can be separately controllable with respect to selectable power modes. Further, each block or sub-block can have separate voltage controller that, for example, includes a voltage converter, regulator, and register for locally storing predetermined, selected, or dynamically adjusted voltage values.

Figure 2:
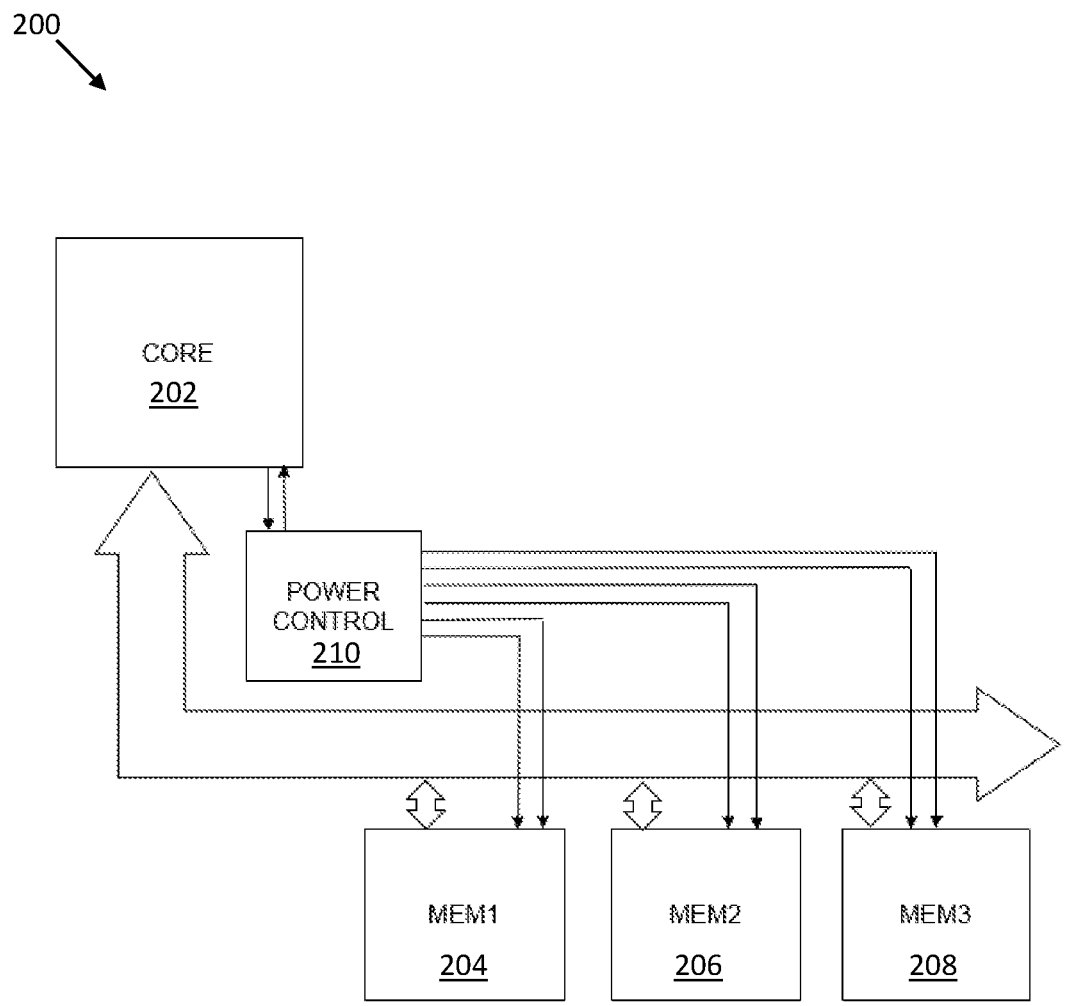
FIG. 2 illustrates connection between a microcontroller core and multiple memory banks.

FIG. 2 provides one example of a processor core connected to multiple memory blocks. A power control block can issue signals controlling the state of each memory block, whether it is selected, de-selected in standby mode, or in retention mode or any other mode designed into the memory block. The power control block can turn off the core if not in use, while the memory can still be accessed by other peripherals (not shown).

This described memory architecture can be particularly useful for power reduction with "just in time wake-up". The processor core can drive calculations, and then send messages to memory. For example, a core can use a high performance MEM1 having a high power usage. When high performance is no longer needed, the core can initiate wake-up of low power MEM2. The core begins a core switch and optional data transfer to MEM2, with the core then putting MEM1 into deep sleep while continuing operations on MEM1. This technique enables concurrent memory blocks to be active or in deep-sleep, and to minimize the impact of the wake-up time associated with switching from deep sleep to active mode. In effect, the microcontroller system memory can be partitioned for power optimization, with well-defined boundaries between active areas and areas in deep-sleep mode.

Figure 3:
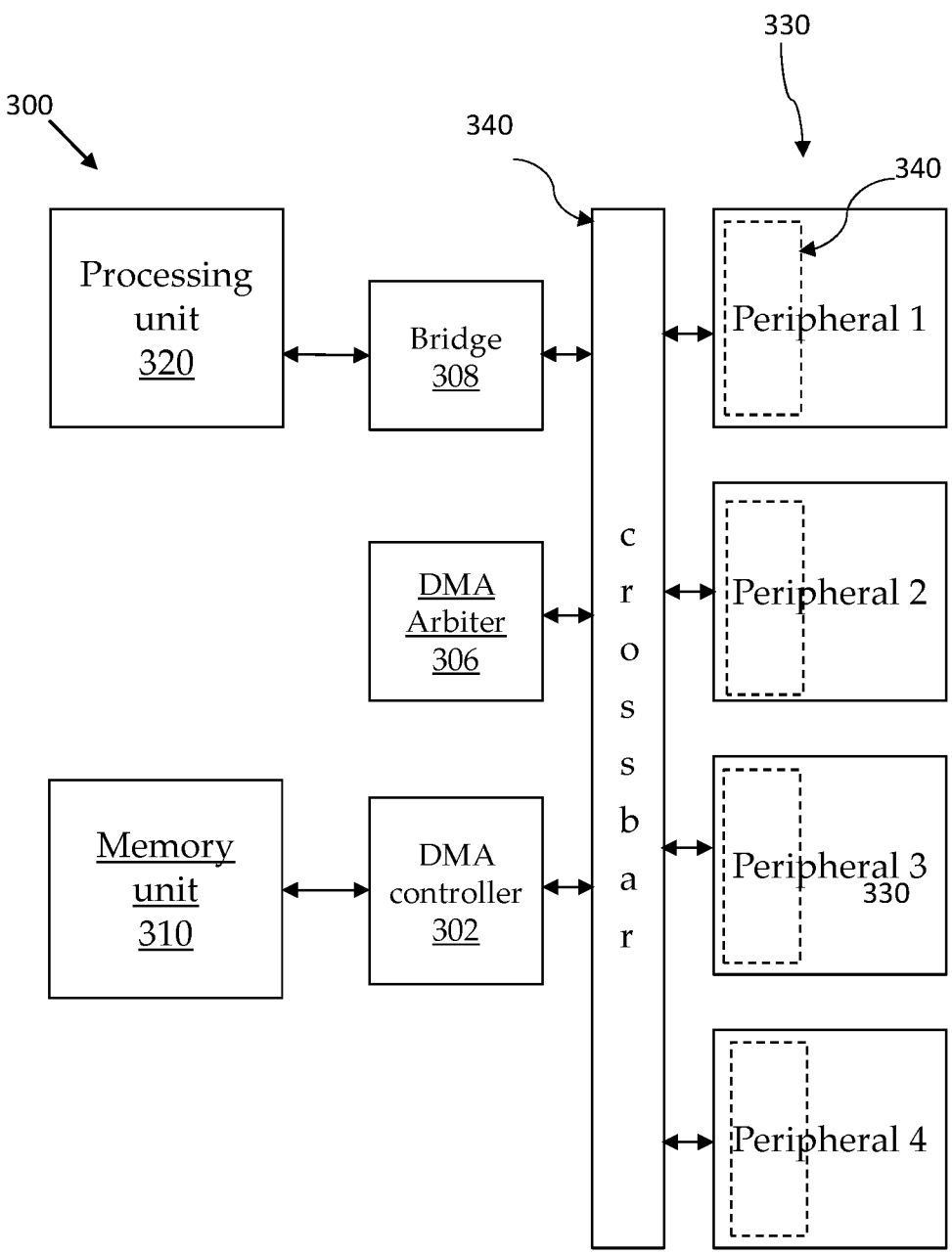
FIG. 3 illustrates memory systems that includes Direct Memory Access (DMA) to peripherals and a DMA arbiter.

FIG. 3 illustrates memory systems that includes Direct Memory Access (DMA) to peripherals and a DMA arbiter. DMA is a commonly used feature of computer systems that allows certain hardware subsystems to access main system memory (RAM), without requiring use of a processing unit such as a CPU, ARM core, DSP, or other logic control system. Without DMA, when a processing unit is using programmed input/output, it is typically fully occupied for the entire duration of the read or write operation, and is thus unavailable to perform other work. With DMA, the processing unit first initiates the transfer, then it does other operations while the transfer is in progress, and it finally receives an interrupt from the DMA controller when the operation is done. This feature is useful at any time that the processing unit cannot keep up with the rate of data transfer, or when the processing unit needs to perform useful work while waiting for a relatively slow I/O data transfer. Many hardware systems use DMA, including disk drive controllers, graphics cards, network cards and sound cards. DMA is also used for intra-chip data transfer in multi-core processors. Computers that have DMA channels can transfer data to and from devices with much less processing unit overhead than computers without DMA channels. Similarly, a processing element inside a multi-core processor can transfer data to and from its local memory without occupying its processor time, allowing computation and data transfer to proceed in parallel.

DMA can usefully provide the ability for a given peripheral to access memory independently, or without requiring intervention by the main processing block. It commonly uses a central DMA controller to process the memory requests. In contrast to traditional DMA systems that commonly implement an array of DMA channels (register blocks) that treat each peripheral as identical, an improved system can customize DMA operations with respect to individual peripherals.

For example, in one embodiment all DMA registers are pushed to the peripherals, allowing DMA resources that are not required to be powered down. Additionally, each peripheral can implement a register implementation that is specific for its requirements. The common portion of the DMA simply provides arbitration and data transfer support via a crossbar, with a bus that enables communication between the different peripherals. Adjacent to the bus is the DMA arbiter, which manages in which order the access requests are handled, and the DMA controller, which controls the read and write operations to the memory unit. A processing unit connect to the crossbar through bridge. Each peripheral unit contains a sub-box with registers to manage the data access to the DMA crossbar.

Each peripheral, processing and memory units may have their own power domain. Each peripheral sub-box with DMA registers is kept within the power domain of the peripheral. This approach reduces power as unused peripherals can be power-gated, and this will power-gate the related DMA registers within the unused peripherals. This approach also eliminates resource contention, compared to a traditional model where all registers are shared in a central DMA controller, as in this approach DMA related registers for each peripherals are not shared but located in the peripherals themselves. Therefore different peripherals can be configured and these configurations maintained while the DMA controller accesses another block.

Circuit techniques can enhance the power and performance of the blocks described in FIG. 1. In particular, these techniques can be: running at a voltage supply close to the threshold voltage of the transistors in the block, power gating an entire block when not in use, or clock gating a block when not in use (i.e. disabling the clock for a given block in order to minimize any amount of switching in that block). Placing memories in deep sleep modes, where data is conserved but a wake-up period is required before accessing the data, can also be used. In cases where really low leakage must be achieved, putting two devices in series, and/or increasing the channel length of these devices will minimize leakage.

Figure 4:
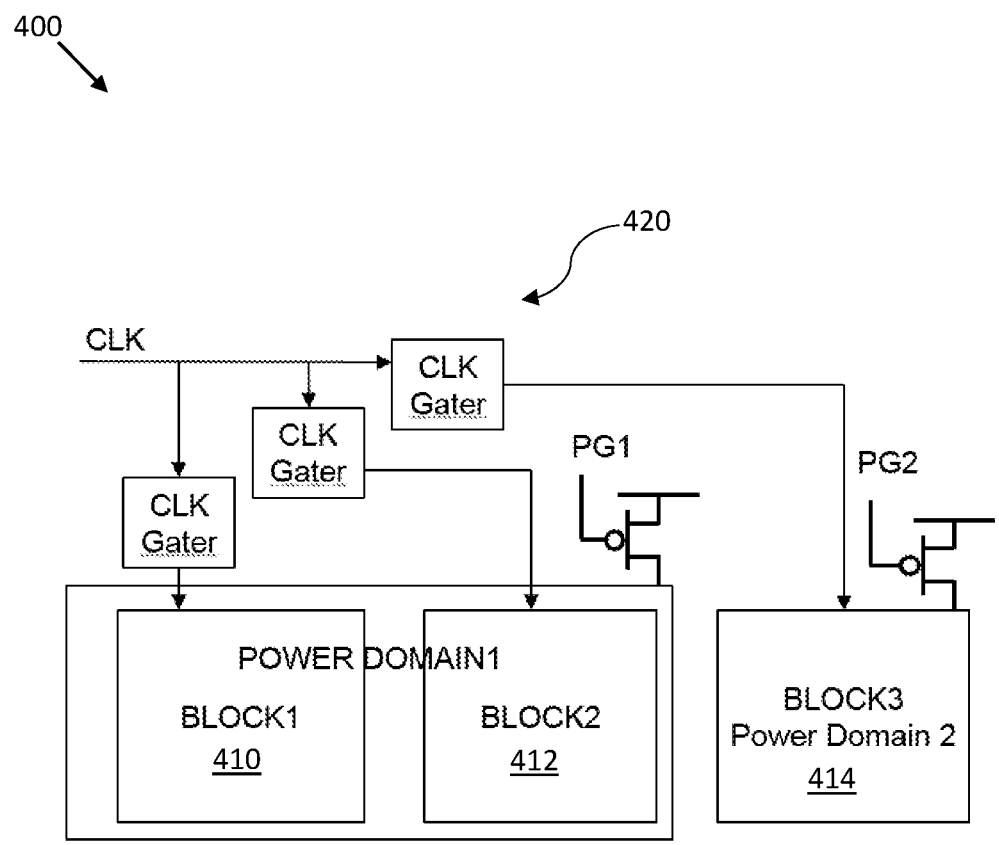
FIG. 4 illustrates group power domains for selected blocks that are further controlled by power gating.

FIG. 4 illustrates such circuit techniques as group power domains for selected blocks and power gating. This architecture allows power gating an entire block when not in use, or clock gating a block when not in use (i.e. disabling the clock for a given block in order to minimize any amount of switching in that block).

In the illustrated embodiment of FIG. 4, a system with two power domains and three functional blocks is shown. To save power, the clock can be cut off with clock gate circuits and activated only when necessary. If power domain 1 is shut down, only the clock going to block 3 is activated. If power domain 1 is up, but only block 2 is active, the clock going to block 1 can be gated off, so as to not create unnecessary switching in block 1. The location of the clock gate circuits can be optimized to minimize the length of the clock lines that have to switch. PG1 and PG2 control the power gating of these two power domains.

Figure 5:
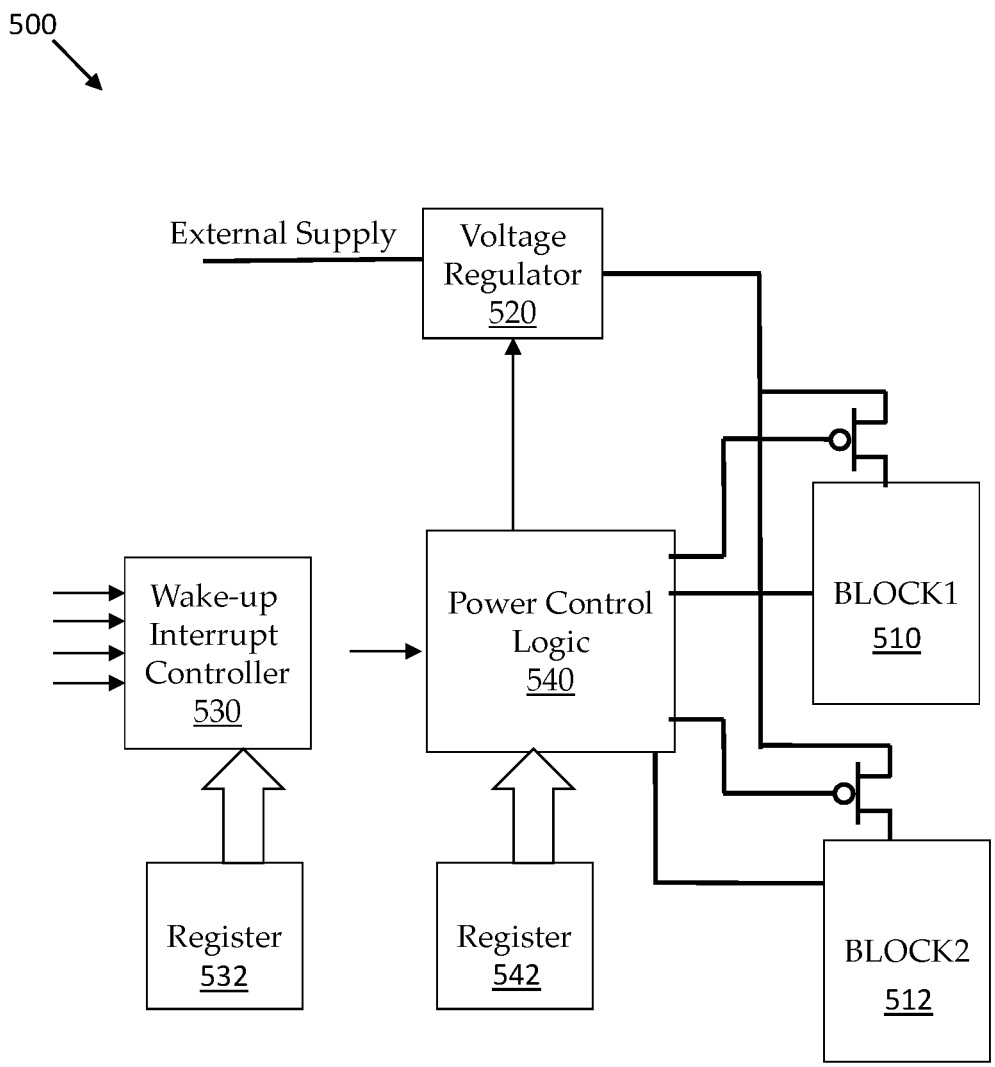
FIG. 5 illustrates a power management unit and wake-up interrupt controller.

FIG. 5 illustrates a power management unit and wake-up interrupt controller. To manage the circuit techniques described above with respect to FIG. 4, and apply them on the blocks described above, it is useful to include a power management unit able to sequence power and act in conjunction with wake-up interrupt controller(s) in some embodiments. Such an embodiment includes a power control block that manages the sequencing of the voltage regulators, the values of the voltage supplies, based on register inputs and a Wake-up Interrupt Controller. It would create the proper signals for power gating a block or putting it in deep sleep. The Wake-up Interrupt Controller could asynchronously respond to functional requests and adjust the power to selected blocks. [Also see U.S. Pat. No. 9,703,313, the disclosure of which is hereby incorporated by reference]. The power management unit is also responsible for sequencing the power gate, reset and isolation of each power domain. Based on the configuration registers, it has a knowledge of which domains to be switched on or off, and staggers the turning on or off the power gates in a way to limit the in-rush current from the voltage regulators. This helps to prevent sudden spikes in the voltage.

Figure 6:
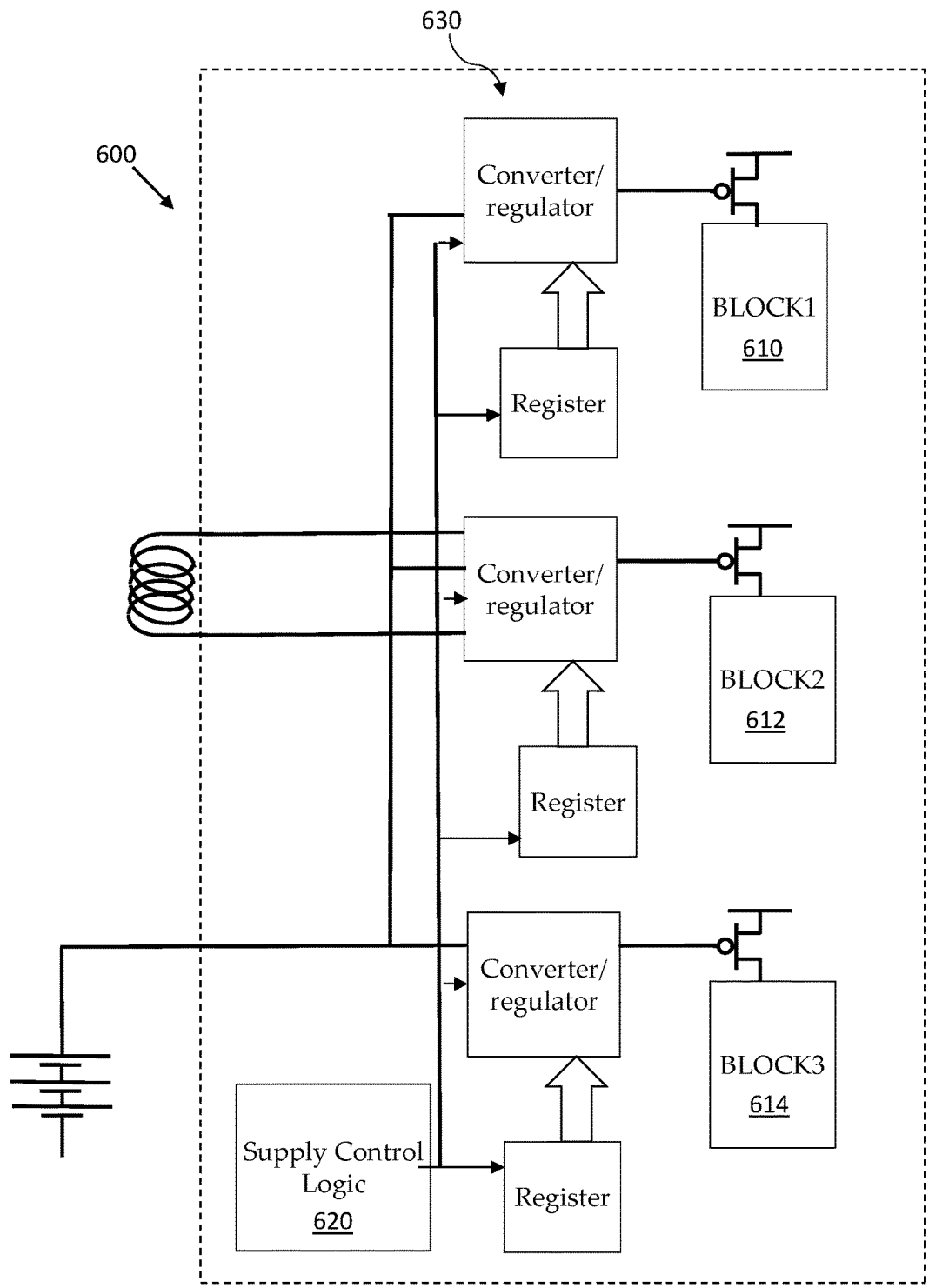
FIG. 6 illustrates voltage regulation of distinct power domain blocks with respective converter/regulators.

FIG. 6 illustrates voltage regulation of distinct power domain blocks with respective converter/regulators. As seen in FIG. 6, a MCU system includes three blocks that are power gated independently. A supply control block can assert which block is enabled, and the voltage converters, which include regulator, will drop the voltage from the battery and apply the appropriate voltage to each block. The supply control circuit can select which register should be able use to modify the voltage. The voltage converter/regulators can be LDO "Low Drop Out" converters or buck converters. For those embodiments including buck converters, one or more external inductors are connected to the buck converter circuit. Upon wake-up from an interrupt, the supply control block can instruct the regulator for a specific block to be at the desired voltage level.

Figure 7:
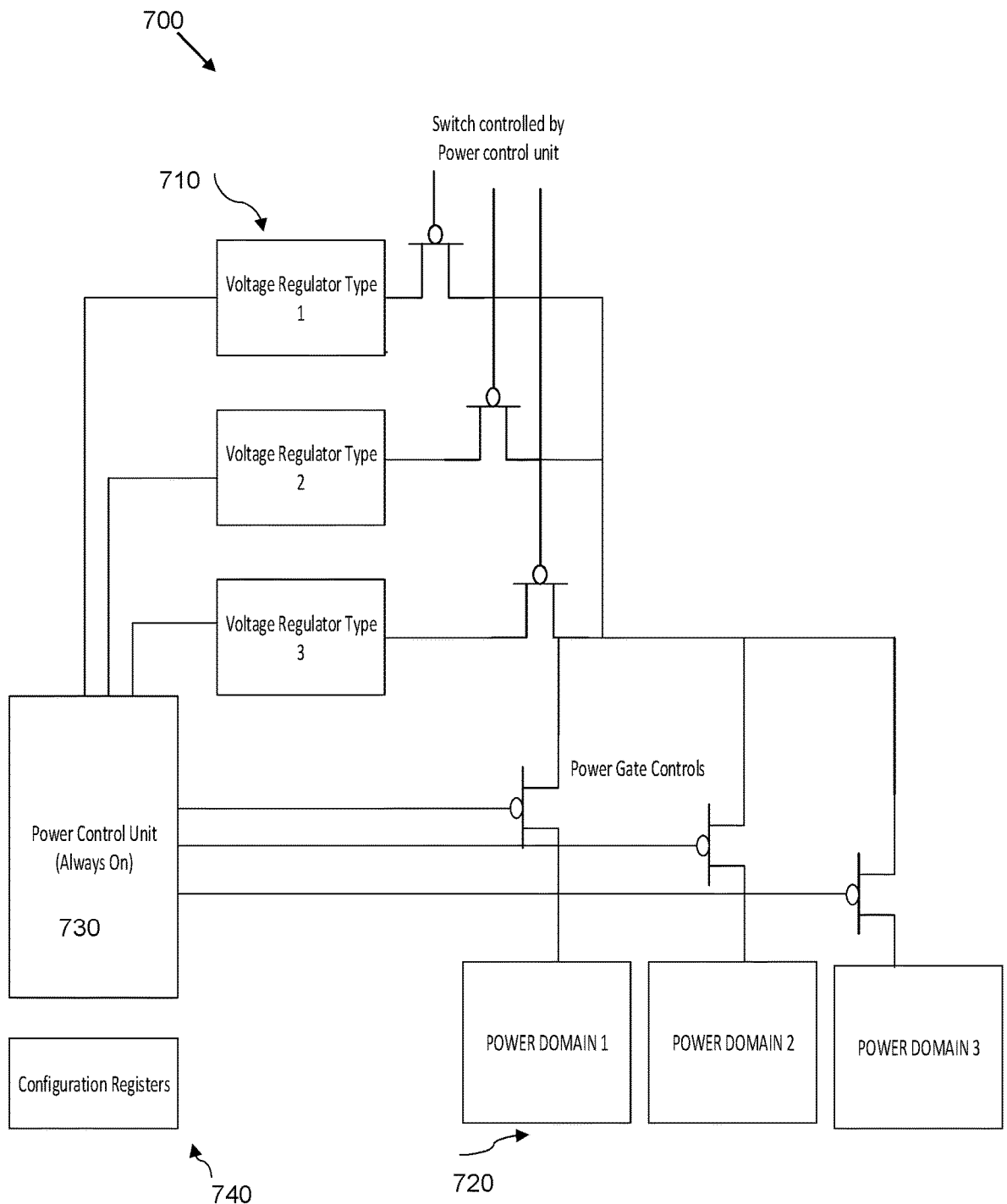
FIG. 7 illustrates use of multiple voltage regulators for each power domain.

FIG. 7 illustrates use of multiple voltage regulators for each power domain, along with configuration registers. Typically, blocks of the MCU can be best powered at different levels. In one embodiment, a battery, with a nominal voltage of 3.3V but actual voltage varying from 1.5V to 4V, depending on the state of charge, can be used to power all the blocks on the MCU. A number of voltage converters will apply the appropriate voltage to each block at the appropriate time. In the embodiment of FIG. 7, 3 blocks can have their power independently controlled, while the voltage applied to the active blocks can be regulated in 3 different ways. Other combinations, not shown, are possible to control the voltage applied or gated to numerous blocks. For example, power domains 1 through 3 could have separate regulators applied in parallel, so that they would have different voltage levels simultaneously.

One of the techniques employed for power management relies on the correct sequencing and selection of the different types of voltage regulators for different use-cases and scenarios. There are different voltage regulators, such as Low Dropout Voltage regulator (LDO) or Buck converters. Depending on the load (use-cases) and the voltage rail requirement, the power control unit switches on or off the regulators that supplies power to the different domains. A typical approach to on-chip voltage generation, usually from a higher battery voltage, will adjust the level of a voltage regulator, so that the output voltage can switch between different values. A different approach, as shown in FIG. 7, consists of using multiple regulators in parallel, and to apply to the designated power domain the output of the appropriate regulator. This approach avoids the power waste associated in bringing up the supply line, and allows for a much faster switching time between supply levels. This requires that all the supply levels be maintained in parallel, causing extra leakage current. This approach is possible when using circuitry with very low leakage current, where keeper circuitry is used to maintain the supply level. Such a circuitry has been described in U.S. patent application Ser. No. 15/439,887, incorporated herewith by reference.

Figure 8:
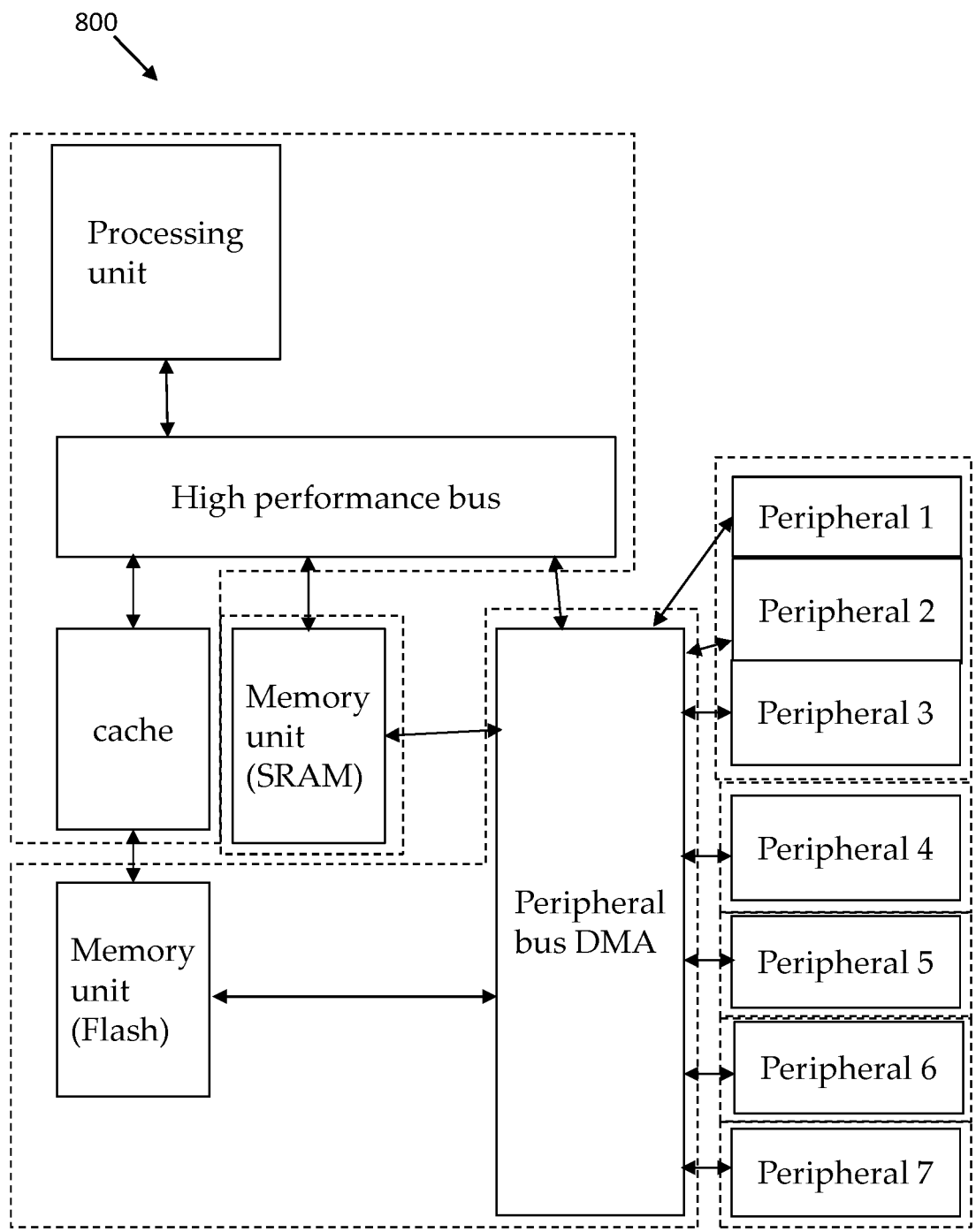
FIG. 8 illustrate use of multiple associated clock and power domains.

FIG. 8 illustrate use of multiple associated clock and power domains, some of which may be asynchronous or out of phase (when same frequency) with respect to each other. It is advantageous to use multiple clocks for different domains, for timing reasons, to avoid having constrained timing across many supply levels and peripherals supporting different applications. Even if blocks are operating at the same frequency, it is advantageous to keep their clocks separate, that is, they could be operating at the same frequency, but out of phase.

In one embodiment, all or most of the peripherals could be grouped by power domain and their clocking isolated primarily to that domain (See FIG. 8, with clock domains delineated with dashed lines, and all blocks with solid lines representing a different power domain). This localizes clock trees to keep them short and minimize the need to balance to other power domains where cells/voltages may differ and cause issues when trying to maintain setup/hold times across corners.

In some embodiments, level shifters may be needed to transpose signals from one supply in one power domain to the supply level in another domain, although a down voltage conversion may not require the addition of a level shifter. Clock partitioning may also be critical. It is advantageous to use multiple clocks for different domains, for timing reason, to avoid having constrained timing across many supply levels and peripherals supporting different applications. Even if blocks are operating at the same frequency, it is advantageous to keep their clocks separate, that is, they could be operating at the same frequency, but out of phase.

Figure 9A:
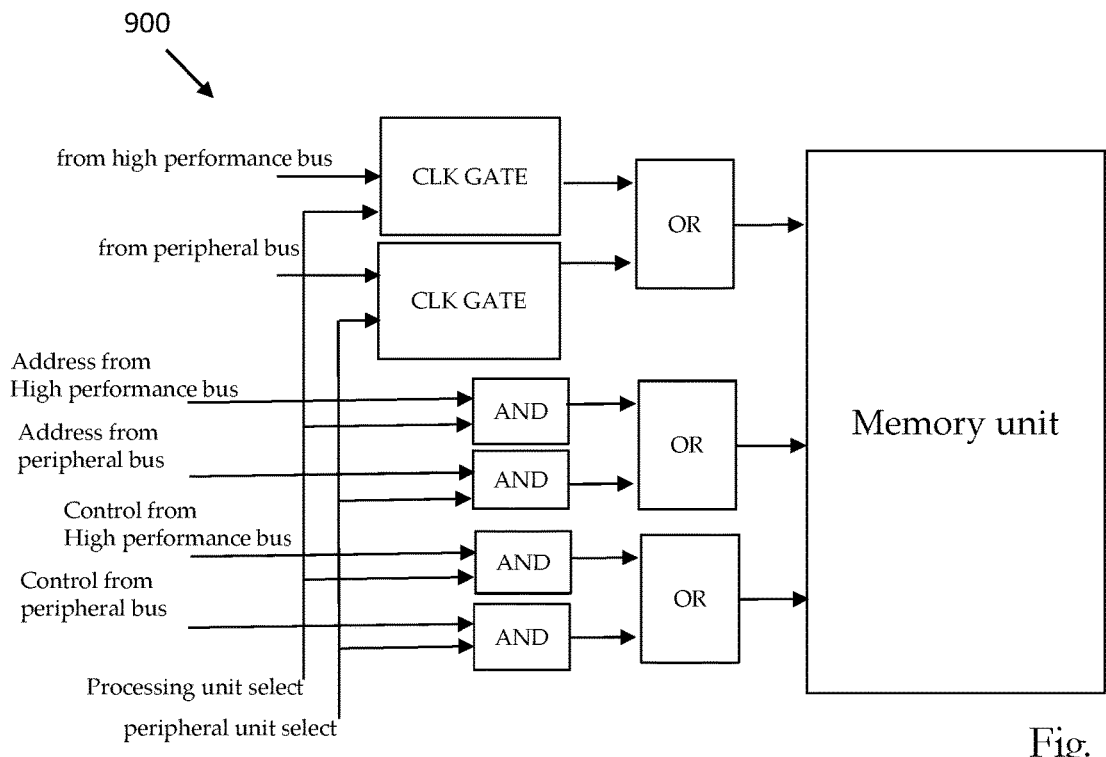
FIGS. 9A-D illustrate various clock embodiments.
Figure 9B:
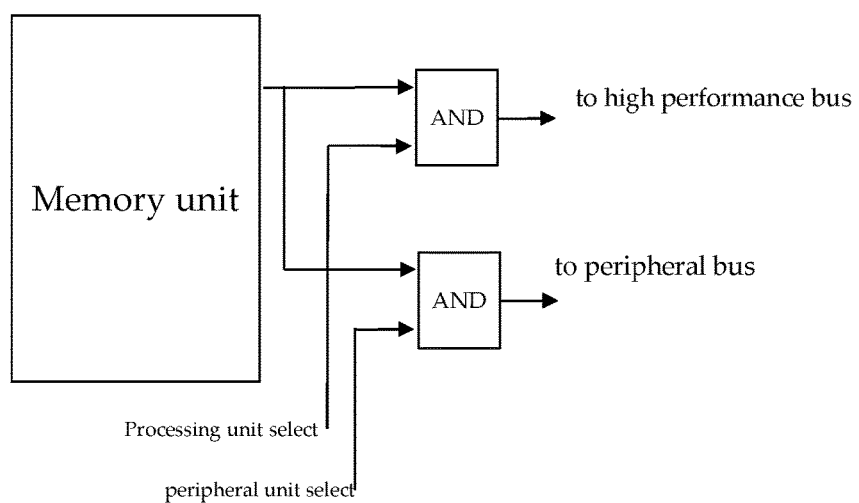
Figure 9C:
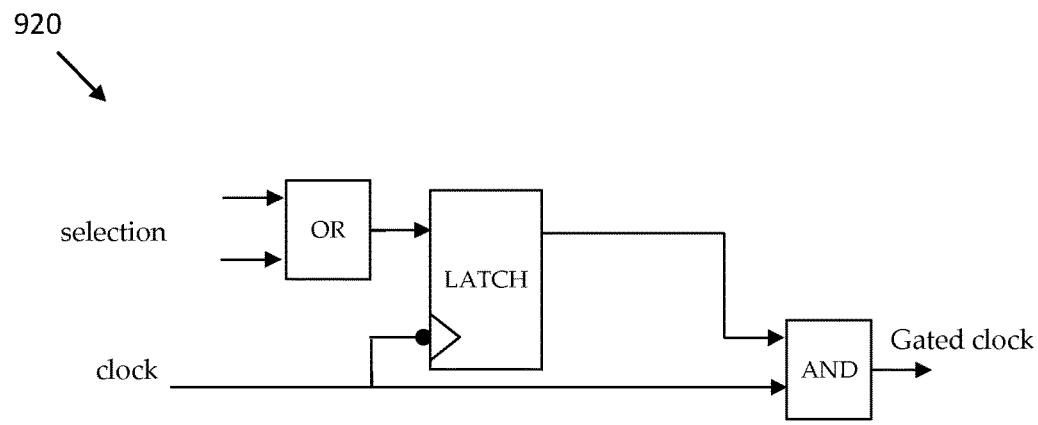
Figure 9D:
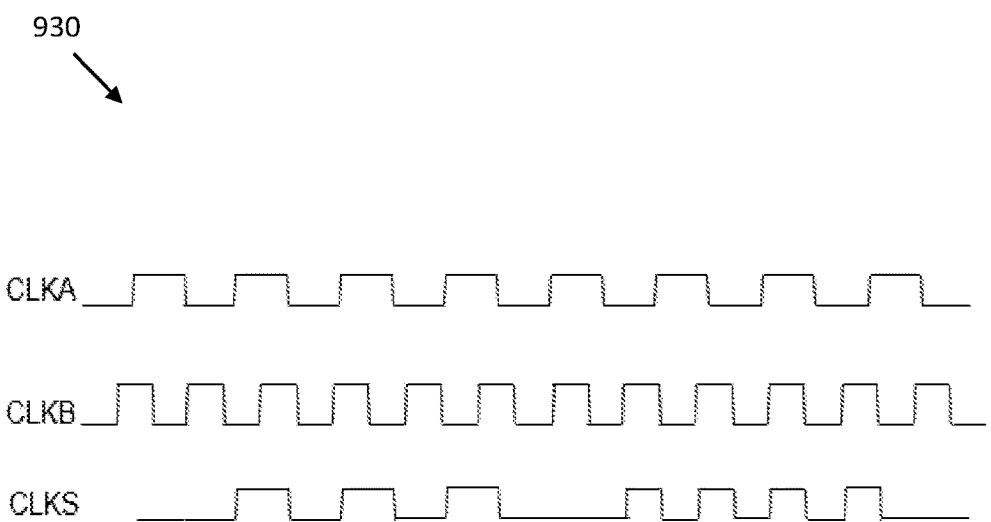

FIGS. 9A-D illustrate various clock embodiments, including Clocks gated by a DMA controller; SRAM clocks without synchronization, an example Clock gate circuit; and SRAM muxing. The clocks driving the SRAM can therefore be provided by different blocks, not necessarily synchronously. As shown in FIG. 9A, clocks are gated by signals provided by the DMA controller in the peripheral bus, or from the processing unit through the high performance bus. FIG. 9B shows how the output of the SRAMs are similarly directed to the appropriate bus. Standard arbitration circuit will decide which path is selected. This technique enables the SRAM to be accessed by different blocks without the need to synchronize the clocks of the different blocks. FIG. 9C shows an exemplary clock gater based on a latch. FIG. 9D shows two clocks A and B being sequentially gated to the clock "CLKS" of an SRAM block. The SRAM muxing can be tied into this in that the CPU is powered down during deep sleep and the arbitration/muxing mechanism for the SRAM RAMs (and the fact that the RAM control logic resides in a switchable SRAM-voltage domain) means that DMA can still access the RAMs when it is powered up while the CPU is in deep sleep.

Figure 10A:
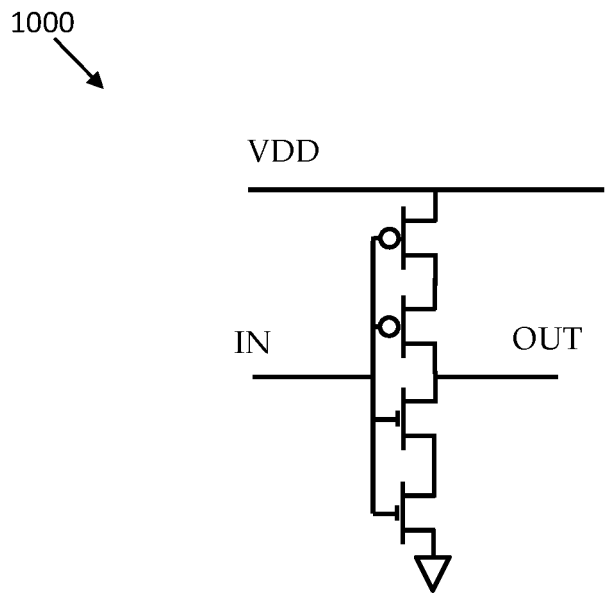
FIGS. 10A and 10B illustrate used of stacked transistors.

FIGS. 10A and B illustrate used of stacked transistors to reduce power leakage. For example, FIG. 10A illustrates an exemplary inverter with stacked transistors. Stacking devices helps create a back-bias on the center devices and reduce leakage when the inverter is not active. A similar technique can be used on all logic gates. Further, the length of the transistor gates could be increased from the minimum allowable to further reduce leakage.

Stacked transistors are of particular use in circuits supporting General Purpose Input Output pads (GPIOs). These circuits provide a buffer for signals outputted by the controller, and an input buffer for the signals going into the controller. These circuits typically have ESD (Electro Static Discharge) protections and their leakage should be kept to a minimum.

Figure 10B:
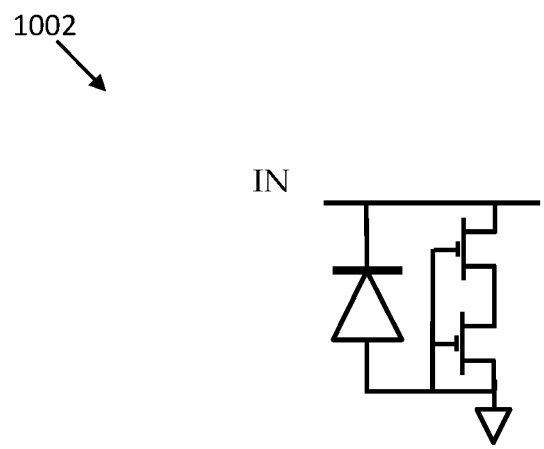

One disadvantage of the stacked devices is that it takes much more die area than a single device, often four times more to achieve the same conductance. In the case of the ESD protections attached to the GPIO pads, it is not always practical to quadruple the area of the devices making the ESD protection. Then replacing some of the devices by diodes, or keeping the devices smaller and adding a diode, may be a better solution. FIG. 10B represents an exemplary ESD protection using stacking devices, with an additional diode.

Various processing techniques are available to minimize power consumption, including techniques to minimize parasitic capacitances. In a first technique, a metal stack (i.e. all the metal layers above the transistors) can be altered to thin down the metal lines. Advantageously, the thinner lines will have reduced side by side capacitances. Thinning lines is achievable in low power mode, in part because the metal lines will need to carry less current than in standard CMOS circuitry.

A second process level technique includes increasing thickness or insulating properties of the Inter Layer Dielectric (ILD). This reduces the line to line capacitance.

A third technique consists in using alternate metal layers and leaving every other metal layer unused for laterally carrying signals. In most cases the unused metal layers will still have pads to pass signals vertically from one layer to the next, and dummy fill patterns which are necessary for the processing of metal layers can be provided to maintain the planarity of the metal stack.

Figure 11A:
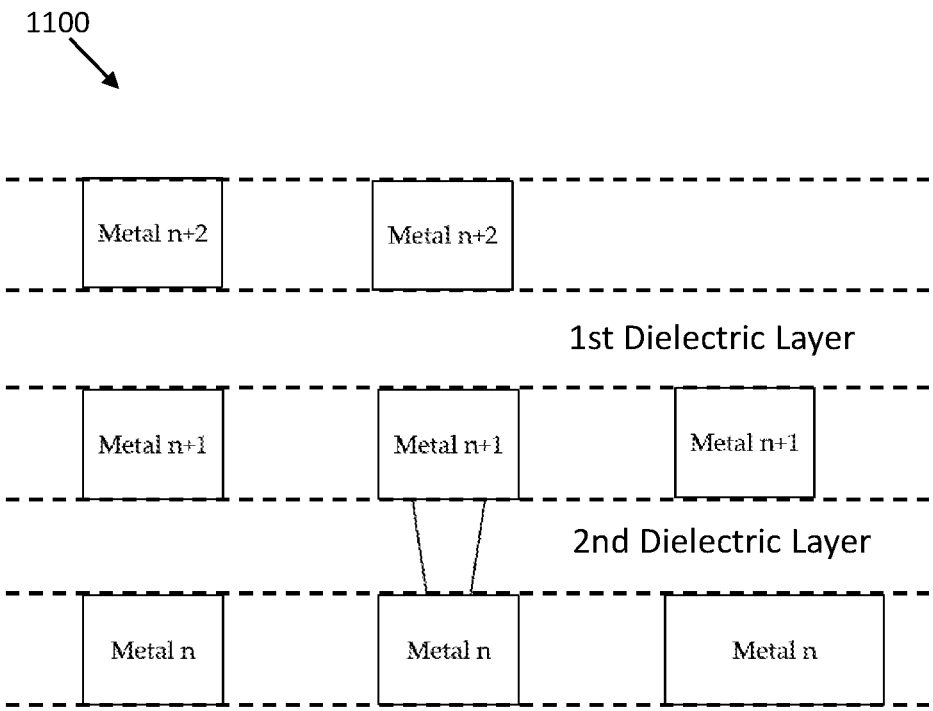
FIGS. 11A and 11B respectively illustrate an exemplary cross-section of a metal stack and a modified metal stack that reduces power usage.
Figure 11B:
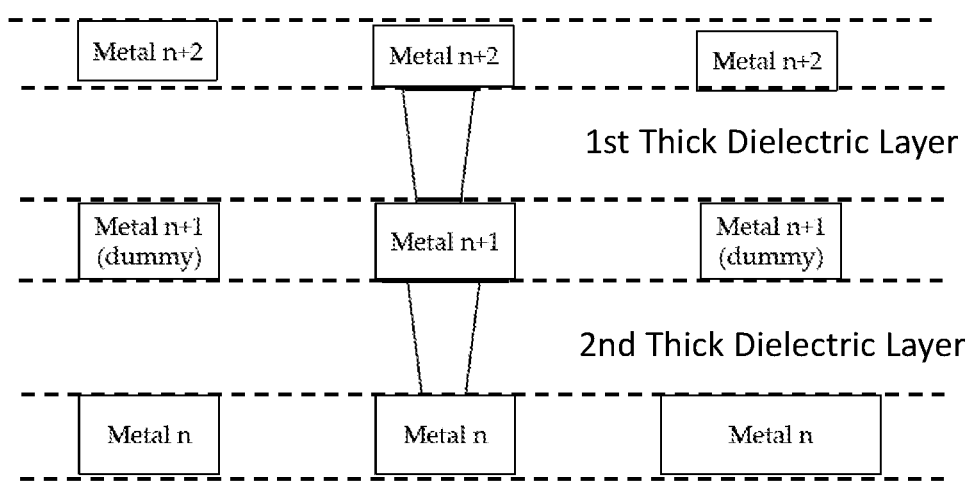

It will be understood that the foregoing described three techniques can be combined in whole or in part to reduce parasitic losses and decrease power usage as illustrated with respect to FIGS. 11A and 11B. FIG. 11A shows an exemplary cross-section of a metal stack, with standard metal layers and dielectric layers of a defined thickness, and one connection from a line formed in layer n to a line formed in layer n+1. FIG. 11B shows the same cross-section as modified according to the described embodiment, with the layer N+1 used only for passing signals from layer n to layer n+2, and modified thicknesses that have been adjusted on all shown layers, both for the metal shapes (reduced thickness)

and the distances in-between the metal shapes (increased thickness of the dielectric layers).

In the foregoing description, reference is made to the accompanying drawings that form a part thereof, and in which is shown by way of illustration specific exemplary embodiments in which the disclosure may be practiced. These embodiments are described in sufficient detail to enable those skilled in the art to practice the concepts disclosed herein.

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

In general, in this disclosure the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive Boolean states may be referred to as logic_0 and logic_1. Consistent system operation can be obtained by reversing the logic sense of all such signals, such that signals described herein as logically true become logically false and vice versa. Furthermore, it is of no relevance in such systems which specific voltage levels are selected to represent each of the logic states.

Reference to a facility or a system can mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities.

Embodiments in accordance with the present disclosure may be embodied in whole or in part as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

Any flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which comprises one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A microcontroller system comprising:
   low threshold voltage transistors;
   high threshold voltage transistors having a threshold voltage greater than the low threshold voltage transistors;
   a processing core having low threshold voltage transistors and operable at a first voltage;
   a first memory block having high threshold voltage transistors and operable at a second voltage higher than the first voltage;
   a peripheral circuit operable at a third voltage; and
   a power control module operable at a fourth voltage.

2. The microcontroller system of claim 1, further comprising a second memory block operable at a voltage distinct from the second voltage.

3. The microcontroller system of claim 1, wherein the first memory block is operable at an adjustable voltage depending on operational mode.

4. The microcontroller system of claim 1, wherein the first memory block is operable at an adjustable voltage depending on temperature.

5. The microcontroller system of claim 1, wherein the first memory block is operable at an adjustable voltage depending on stored process corner characteristics information.

6. The microcontroller system of claim 1, wherein the first memory block further comprises an internal supply voltage control having a voltage converter and regulator.

7. The microcontroller system of claim 6, wherein the internal supply voltage control includes at least one of a buck converter and a LDO.

8. The microcontroller system of claim 1, further comprising a cache block having low threshold voltage transistors and operable at a fifth voltage greater than the second voltage.

9. The microcontroller system of claim 1, wherein processing core and the first memory block are independently power gated by the power control module.

10. The microcontroller system of claim 1, wherein the first memory block is an SRAM block having operational modes that include active mode and retention mode.

11. The microcontroller system of claim 1, wherein the first memory block further comprises first and second SRAM blocks operable at distinct voltages, the voltage values being at least one of a predetermined value, a selected value, and a dynamically adjusted value.

12. The microcontroller system of claim 11, wherein each of the first and second SRAM blocks has an internal supply voltage control and a local register for storing at least one voltage value.

13. The microcontroller system of claim 1, wherein at least a portion of the processing core is operable at sub-threshold or near-threshold voltages.

14. The microcontroller system of claim 1, wherein at least some of the low threshold voltage transistors can be body biased.

15. The microcontroller system of claim 1, wherein the peripheral circuit includes an always-on circuit.

16. A microcontroller system comprising:
a processing core in a first power domain supplied at a first voltage, and having at least some low Vt transistors;
a first memory block in a second power domain supplied at a second voltage, the memory block having at least some high Vt transistors and an internal supply voltage control having a voltage converter and regulator; and
wherein
the processing core and the memory block are independently power gated by power control circuits controlled by a power control module.

17. The microcontroller system of claim 16, further comprising a second memory block operable at a voltage distinct from the second voltage.

18. The microcontroller system of claim 16, wherein the first memory block is operable at an adjustable voltage depending on operational mode.

19. The microcontroller system of claim 16, wherein the first memory block is an SRAM block having operational modes that include active mode and retention mode.

20. The microcontroller system of claim 16, wherein the first memory block further comprises first and second SRAM blocks operable at distinct voltages, the voltage values being at least one of a predetermined value, a selected value, and a dynamically adjusted value.

21. The microcontroller system of claim 20, wherein each of the first and second SRAM blocks has a local register for storing at least one voltage value.

22. The microcontroller system of claim 16, wherein at least a portion of the processing core is operable at sub-threshold or near-threshold voltages.

* * * * *